(12) United States Patent
Ishimura

(10) Patent No.: US 7,109,523 B2
(45) Date of Patent: Sep. 19, 2006

(54) PACKAGE FOR OPTICAL SEMICONDUCTOR DEVICE

(75) Inventor: Eitaro Ishimura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 224 days.

(21) Appl. No.: 10/786,069

(22) Filed: Feb. 26, 2004

(65) Prior Publication Data

US 2004/0188698 A1    Sep. 30, 2004

(30) Foreign Application Priority Data

| Mar. 27, 2003 | (JP) | ............................. | 2003-088306 |
| Aug. 13, 2003 | (JP) | ............................. | 2003-293105 |

(51) Int. Cl.
  *H01L 27/15* (2006.01)
  *H01L 31/15* (2006.01)
  *H01L 33/00* (2006.01)
(52) U.S. Cl. ........................................ 257/81; 257/99
(58) Field of Classification Search ................. 257/81, 257/99, 98
See application file for complete search history.

(56) References Cited

U.S. PATENT DOCUMENTS

| 5,262,675 A | 11/1993 | Bausman, Jr. |
| 5,504,349 A * | 4/1996 | Yoshino ........................ 257/82 |
| 6,777,792 B1 * | 8/2004 | Yoshida et al. .............. 257/678 |
| 2002/0041612 A1 | 4/2002 | Shiomoto et al. |
| 2002/0141142 A1 | 10/2002 | Rookes |

FOREIGN PATENT DOCUMENTS

| JP | 58-98995 | 6/1983 |
| JP | 7-240565 | 9/1995 |

* cited by examiner

*Primary Examiner*—Phat X. Cao
(74) *Attorney, Agent, or Firm*—Leydig, Voit & Mayer, Ltd.

(57) ABSTRACT

A stem package with good high frequency characteristics for high-speed transmission at 10 Gbps and higher includes a stem which has an under surface, an upper surface and one or more through holes penetrating from the upper surface to the under surface, a mount for mounting, with an optical semiconductor device, on the upper surface, a lead terminal for signal supply penetrating one of the through holes with an insulator between the stem and the lead terminal, the upper surface having an earth conductor adjacent to the lead terminal for signal supply and Projecting from the upper surface so that a difference between the characteristic impedance of the transmission line constituted by the through hole, the insulator, and the lead terminal for signal supply and the characteristic impedance of the transmission line constituted by a lead terminal for signal supply projecting from the upper surface is small.

20 Claims, 23 Drawing Sheets

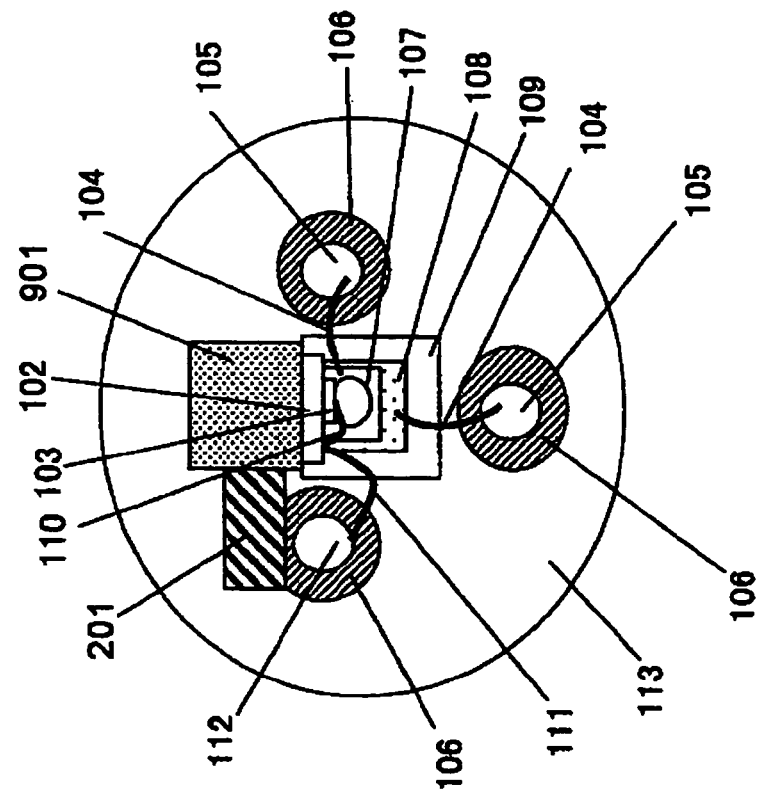
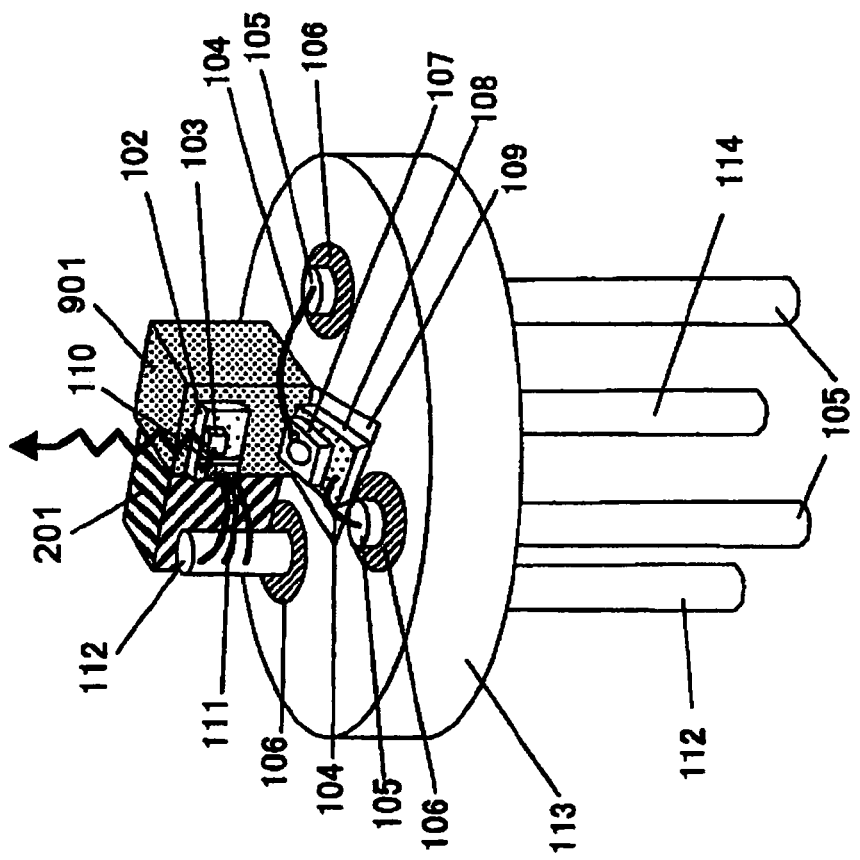
Fig. 3B
Fig. 3A

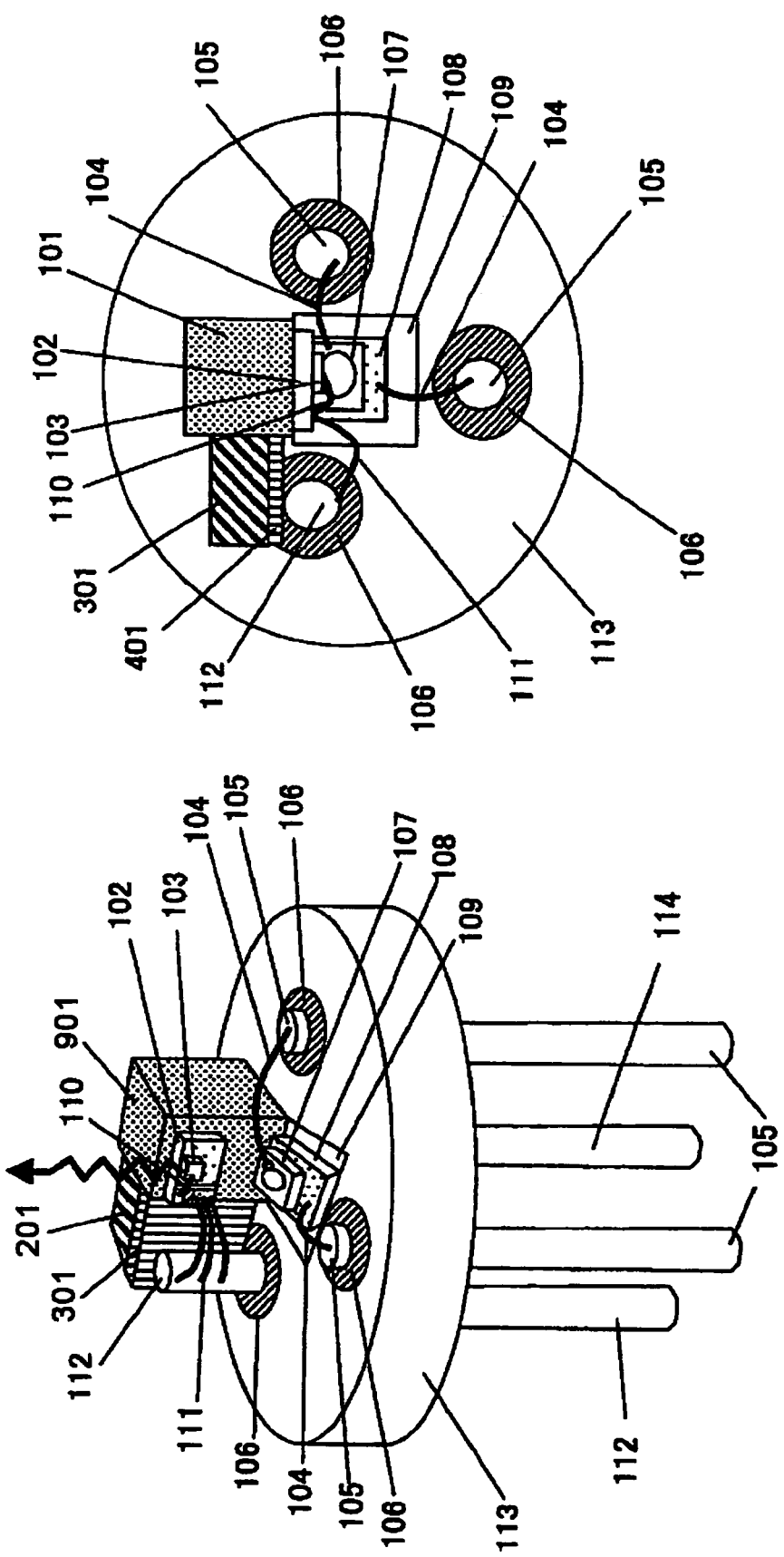

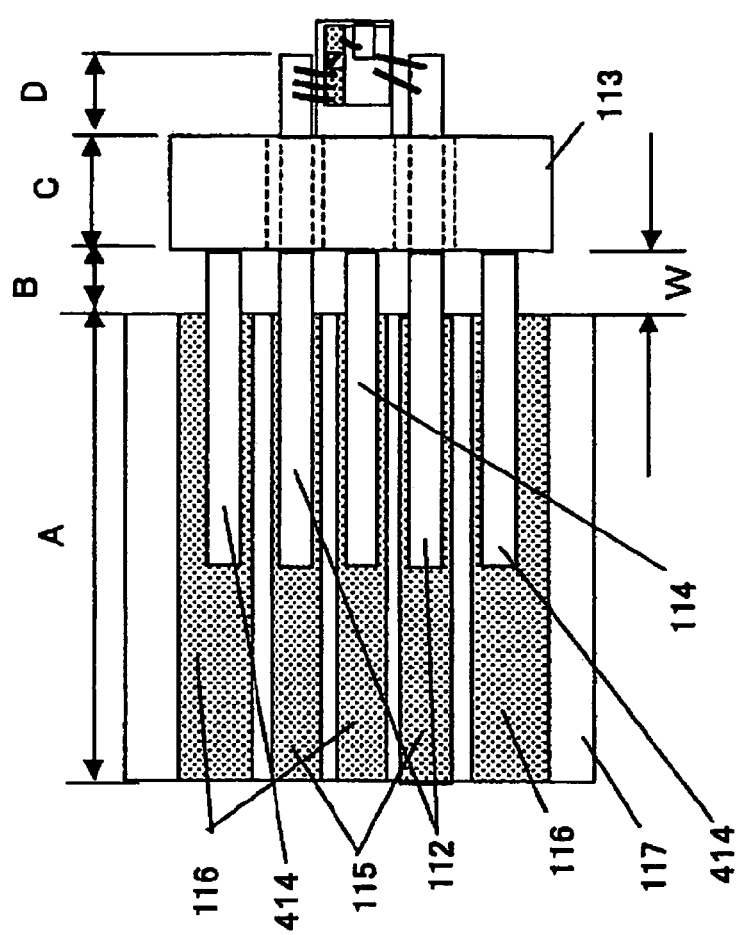
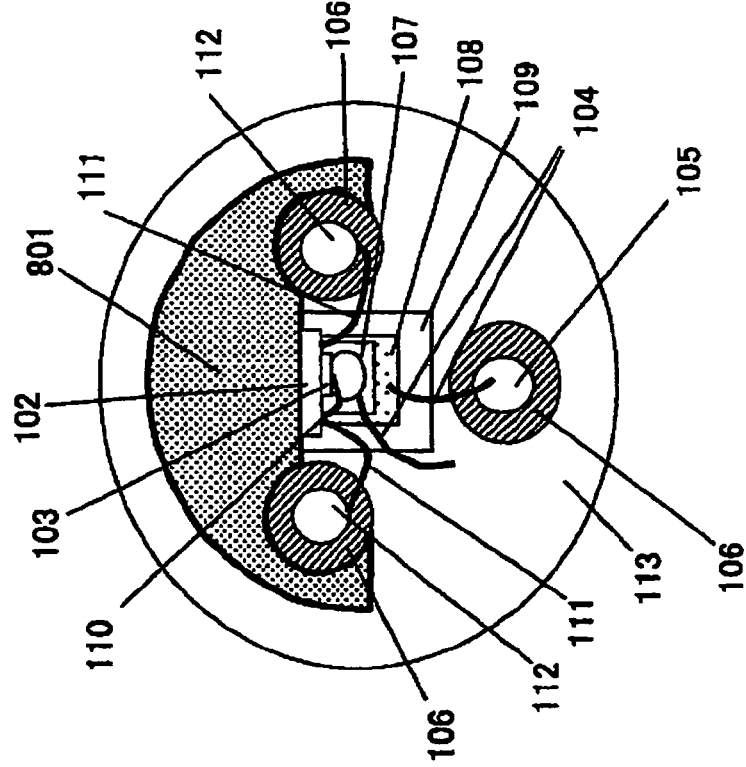
Fig. 8A
Fig. 8B

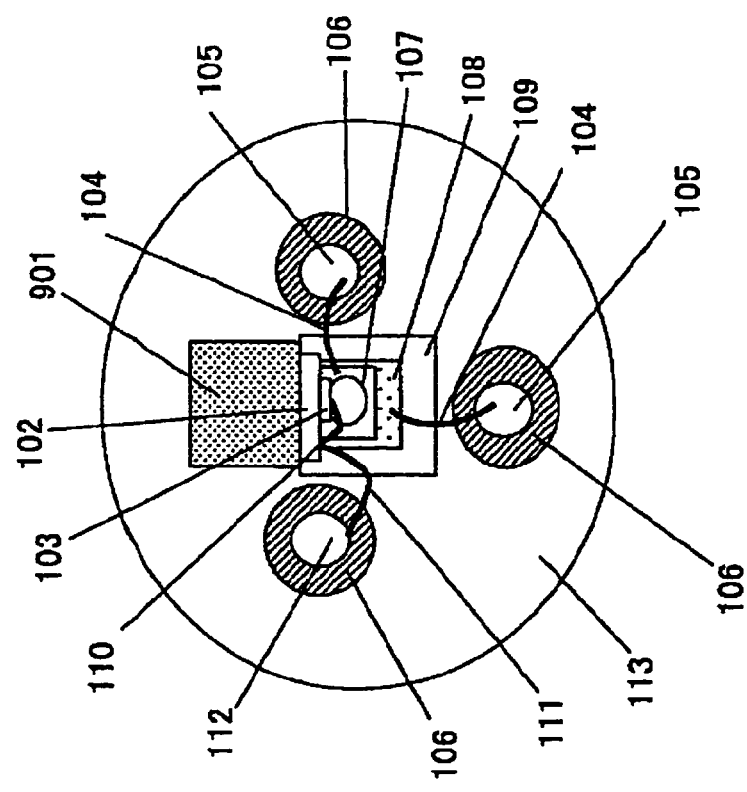
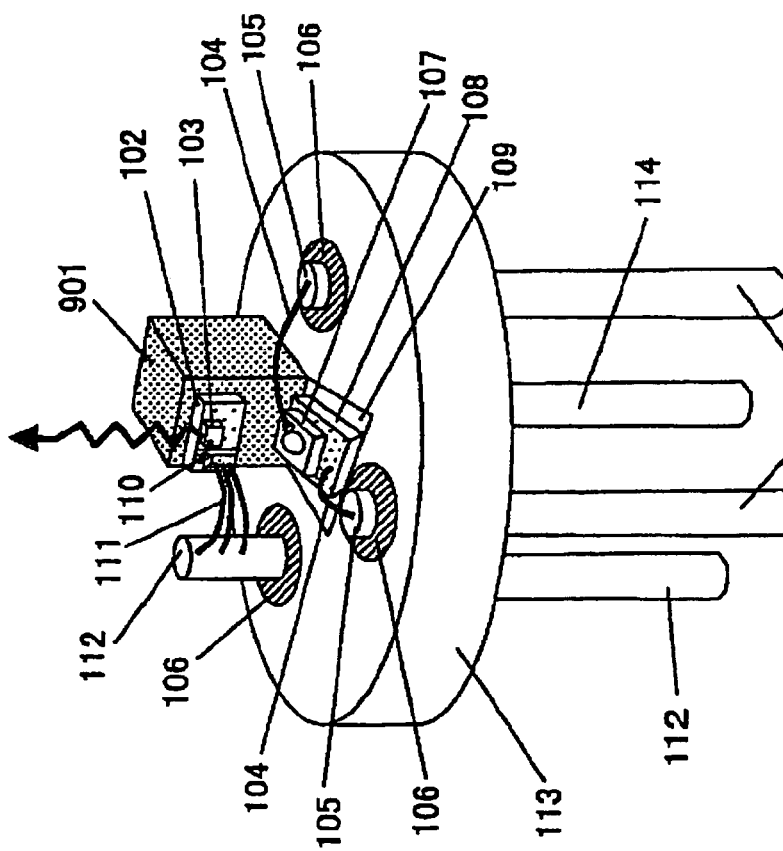
Fig. 9A PRIOR ART
Fig. 9B PRIOR ART

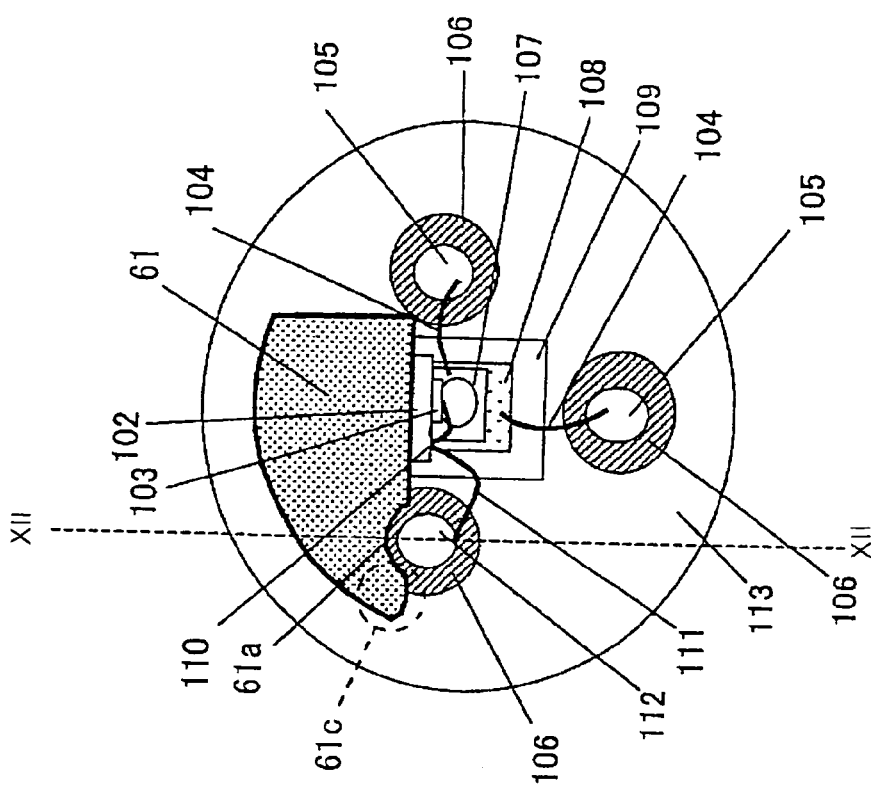
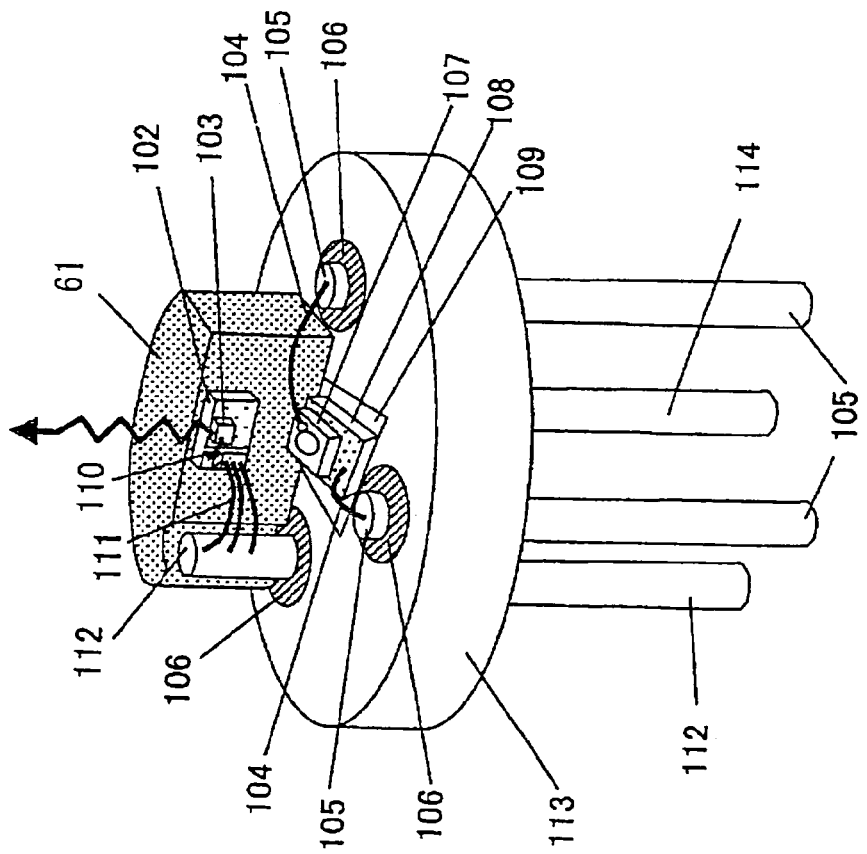
Fig. 11A
Fig. 11B

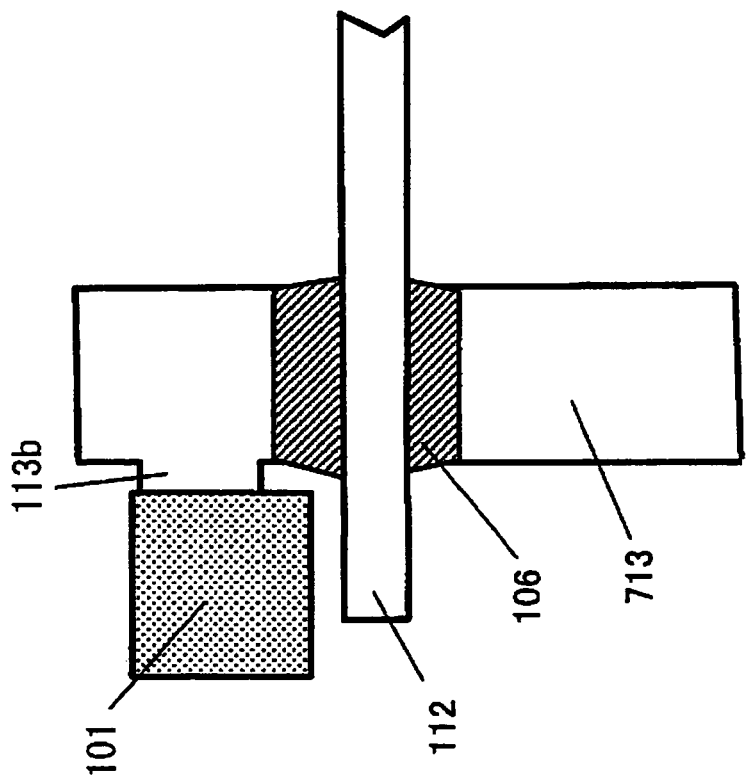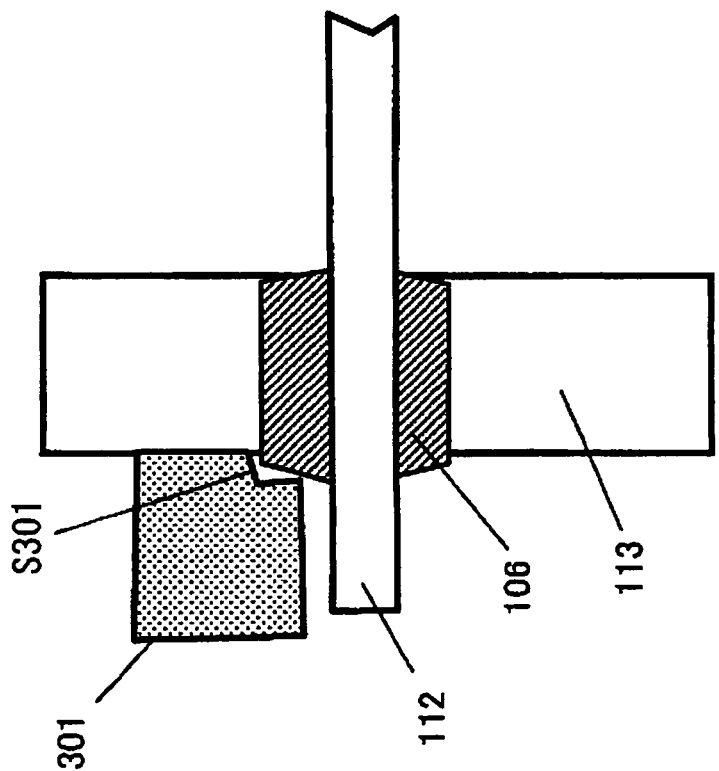

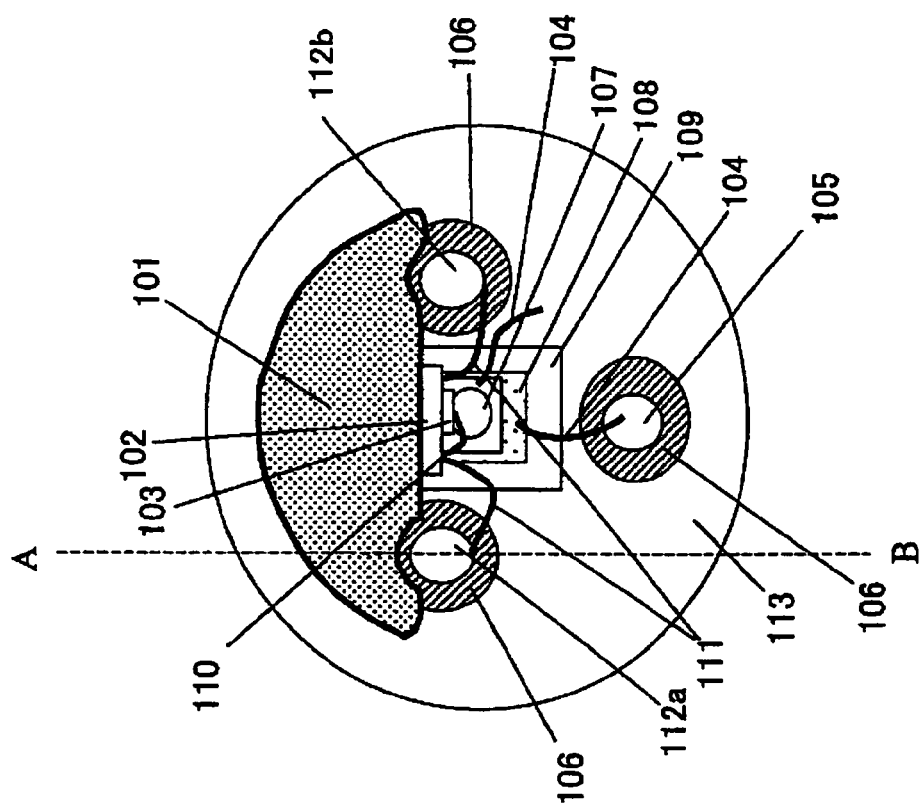
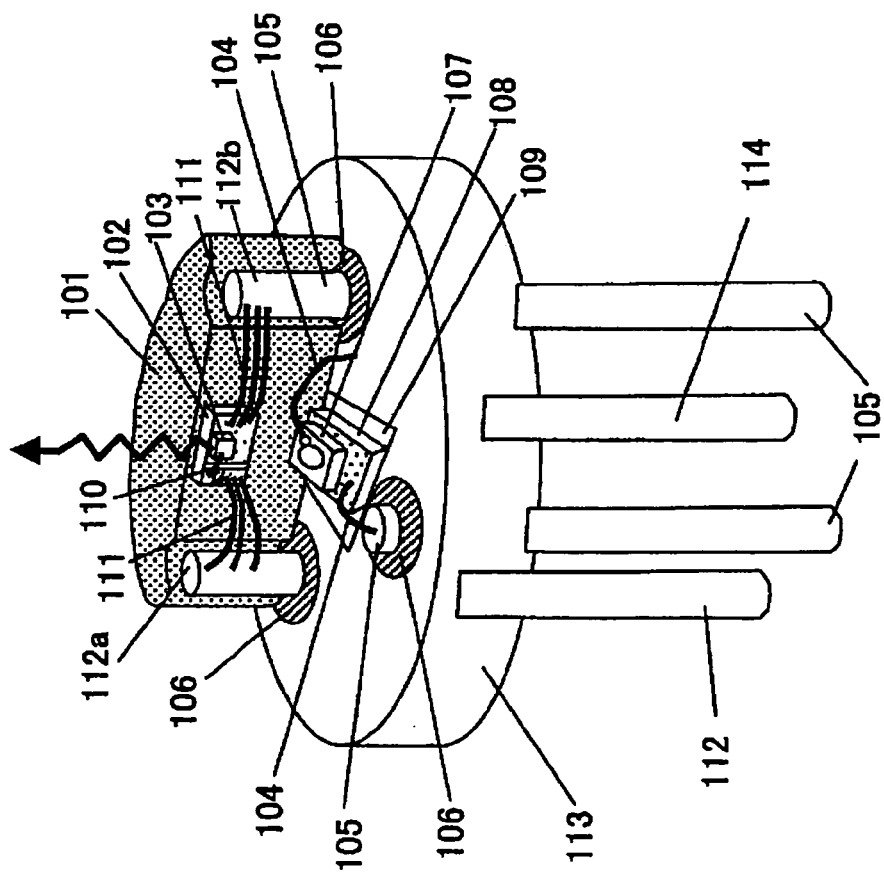
Fig. 21A
Fig. 21B

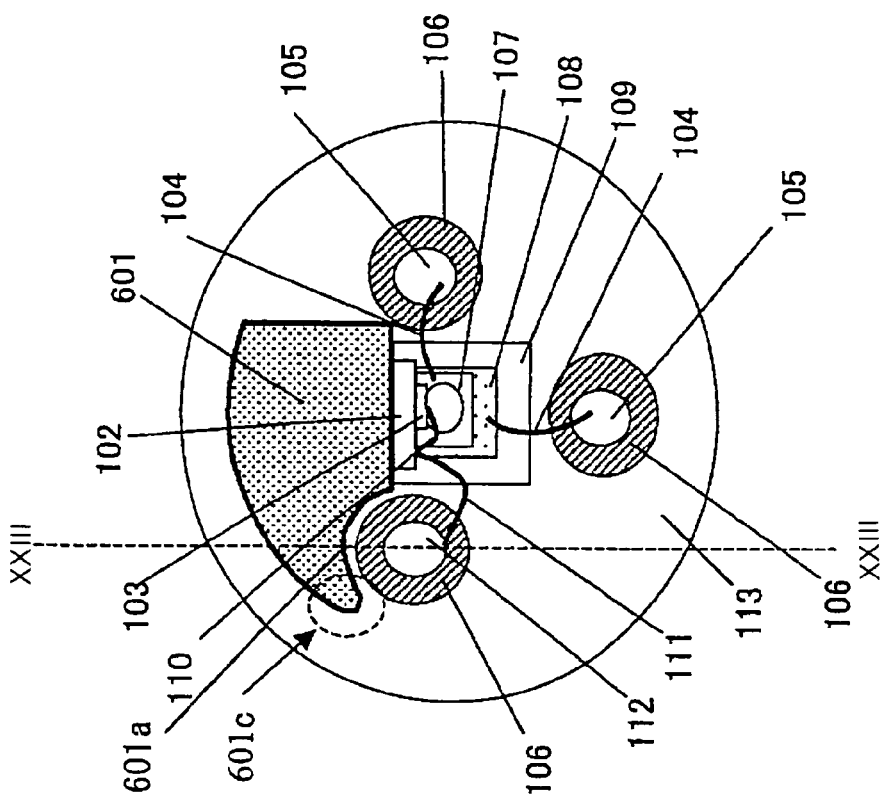
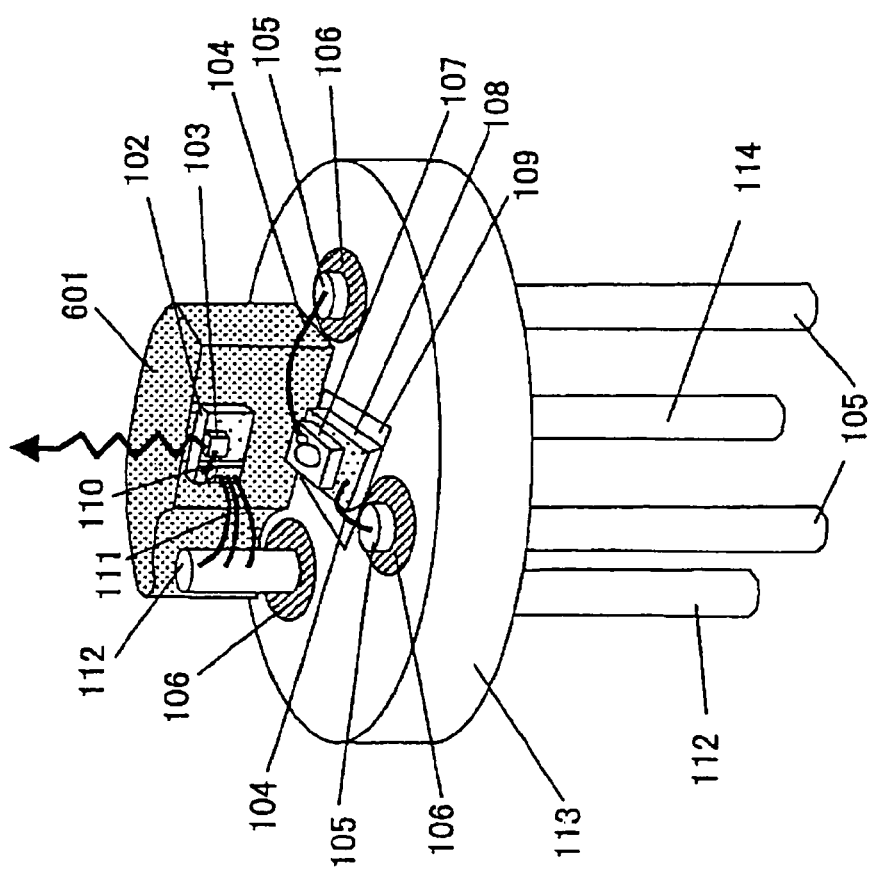
Fig. 22A
Fig. 22B

PACKAGE FOR OPTICAL SEMICONDUCTOR DEVICE

BACKGROUND OF THE INVENTION

1. Field of the Invention

This invention relates to packages for optical semiconductor devices, especially a package for optical semiconductor devices that are excellent in high frequency characteristics.

2. Description of the Background Art

In recent years, the transmission rate is accelerated one after another from 600 Mbps to 2.5 Gbps, moreover to 10 Gbps, in the field of optical communications. Therefore, the light emitting devices and the photo detectors for optical transmitter-receivers are required for quick-operating. With this, good high frequency characteristics and low cost are required for the packages of the light emitting devices and the photo detectors. There are a stem type package in coaxial form having a simple structure and a butterfly type package using a strip line in box form for the light emitting devices and the photo detectors.

The conventional stem package includes a stem-body 113, as shown in FIG. 9A and FIG. 9B. A pair of lead terminals 105 for photodiodes and a lead terminal 112 for signal supply are inserted in respective through holes of stem-body 113 and insulated by glass 106. Moreover, a sub-mount 102 and a mount 901, in which a semiconductor laser 103 is mounted, adjoins the lead terminal 112 for signal supply on the upper surface of the stem-body 113, and a recess 109, in which sub-mount 108 and the photodiode 107 for monitoring are attached, is located at the upper surface of stem-body 113. Here, the recess 109 is located where the laser light from the monitor face, opposite to light emitting face of the semiconductor laser diode, is input into the photodiode 107 for monitoring, mounted on sub-mount 108. In addition, an earth lead terminal 114 is attached as in FIG. 9A.

A semiconductor laser 103 is mounted on one side of mount 901 with sub-mount 102 between them, the photodiode 107 for monitor is mounted on the recess 109 with sub-mount 108 between them and then the predetermined lead terminals are connected with a wire 104,110,111. Thereby, a semiconductor laser device having the stem formed as mentioned above is constituted (for example, U.S.P. non examined publication No. 2002/0041612A1, and 2002/0141142A1).

In the semiconductor laser device formed as mentioned above, when a voltage of about 1.5 V is applied between the lead terminal for signal supply 112 and the earth lead terminal 114, an electrical current of tens of mA flows in the semiconductor laser device and laser light is emitted. The light emitted from the face opposite to the light emitting face is detected at the monitor photodiode 107 to control the quantity of the emitted light.

Stem packages for optical semiconductor device, with good heat radiating properties for radiating the heat generated by the semiconductor laser devices, are shown in Japanese Non-examined Patent Publications No.58-98995, No.07-240565 and U.S. Pat. No. 5,262,675.

However, in the conventional package for an optical semiconductor device, although the high frequency characteristics of a butterfly package are good, it is made very expensive by the complicated structure. On the other hand, although the stem package is cheap, high frequency characteristics are not good, so it is difficult to use for high-speed transmission at 10 Gbps or more.

SUMMARY OF THE INVENTION

Therefore, an object of the invention is to provide a stem type package with good high frequency characteristics, which can be used for high-speed transmission of 10 Gbps or more.

The package for Optical semiconductor devices of the invention includes a stem which has an under surface, an upper surface and one or more through holes penetrating from the upper surface to the under surface, a mount to be mounted with an optical semiconductor device on the upper surface, a lead terminal for signal supply penetrating one of the through holes so as to be insulated by an insulator. And in order to attain the object, the package of the present invention is characterized in that the upper surface has an earth conductor adjacent to the lead terminal for signal supply projected from the upper surface so that a difference between the characteristic impedance of the transmission line constituted with the through hole, the insulator and the lead terminal for signal supply and the characteristic impedance of the transmission line constituted with a lead terminal for signal supply projected from the upper surface becomes small.

According to the present invention, the stem type packages for Optical semiconductor devices having good high frequency characteristics, which can be used for high-speed transmission of 10 Gbps or more, can be obtained.

BRIEF DESCRIPTION OF THE DRAWINGS

FIG. 3A is a perspective view of the optical semiconductor device of Embodiment 2 of the present invention.

FIG. 3B is a plan view of the optical semiconductor device of Embodiment 2 of the present invention.

FIG. 4A is a perspective view of the optical semiconductor device of Embodiment 3 of the present invention.

FIG. 4B is a plan view of the optical semiconductor device of Embodiment 3 of the present invention.

FIG. 8A is a perspective view of the optical semiconductor device of Embodiment 5 of the present invention.

FIG. 8B is a plan view of the optical semiconductor device of Embodiment 5 of the present invention.

FIG. 9A is a perspective view of the conventional optical semiconductor device.

FIG. 9B is a plan view of the conventional optical semiconductor device.

FIG. 11A is a perspective view of the optical semiconductor device of Embodiment 6 of the present invention.

FIG. 11B is a plan view of the optical semiconductor device of Embodiment 6 of the present invention.

FIG. 19A is a partial cross sectional view of the lead terminal for signal supply 112 and its periphery in the optical semiconductor device of Embodiment 10.

FIG. 19B is a partial cross sectional view of the lead terminal for signal supply 112 and its periphery in the optical semiconductor device of Embodiment 11.

FIG. 21A is a perspective view of the optical semiconductor-device of a variation example of the present invention.

FIG. 21B is a plan view of the optical semiconductor device of a variation example of the present invention.

FIG. 22A is a perspective view of the optical semiconductor device of the comparative example.

FIG. 22B is a plan-view of the optical semiconductor device of the comparative example.

DETAILED DESCRIPTION OF THE PREFERRED EMBODIMENTS

Figure 1:
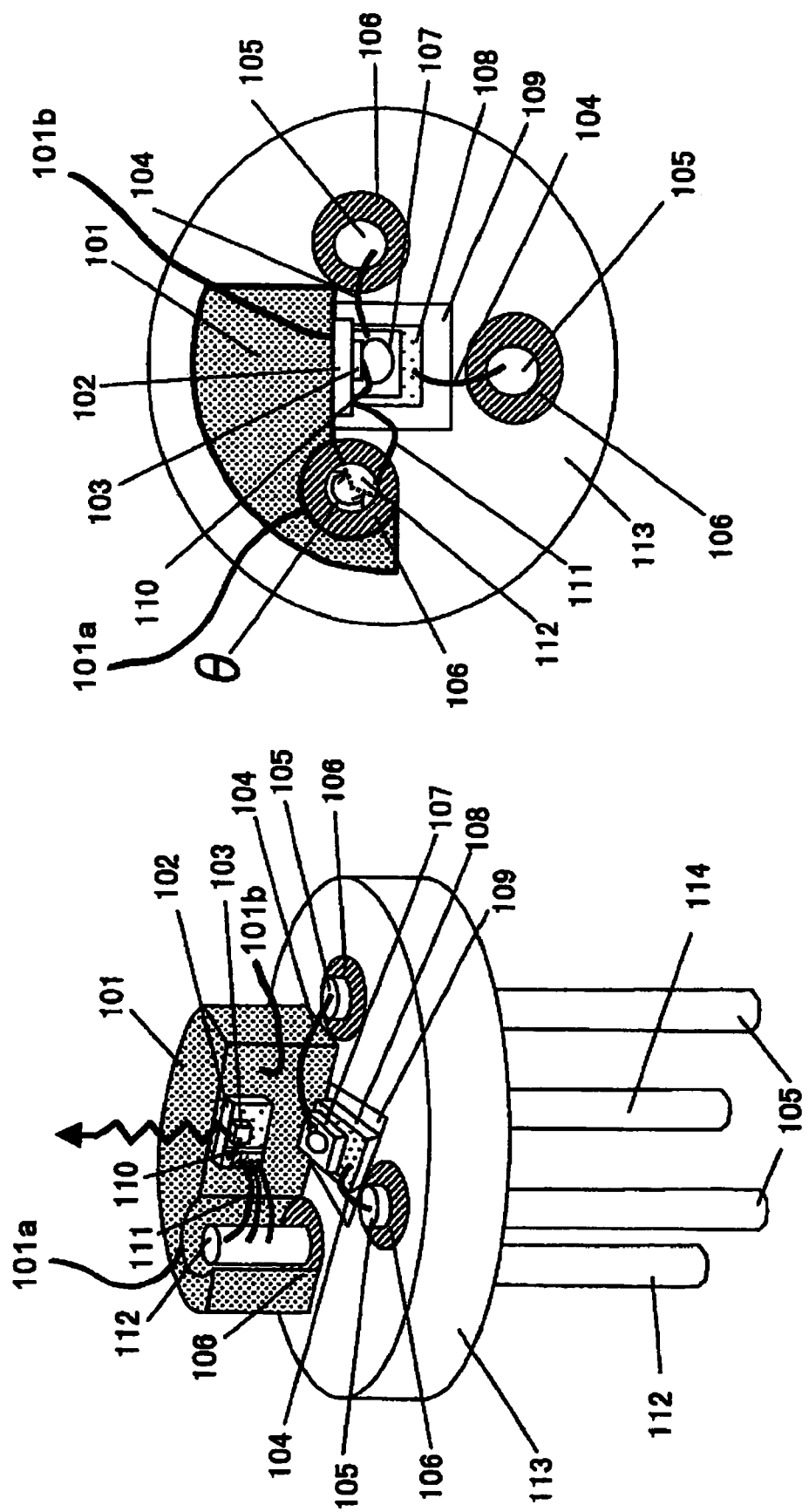
FIG. 1A is a perspective view of the optical semiconductor device of Embodiment 1 of the present invention.
FIG. 1B is a plan view of the optical semiconductor device of Embodiment 1 of the present invention.

Hereafter, the optical semiconductor device of the embodiment according to the invention is explained, referring to the drawings.

Embodiment 1

FIGS. 1A and 1B are a perspective diagram and plane view of the optical semiconductor device of Embodiment 1 concerning this invention.

The optical semiconductor device of this embodiment 1 is a laser device for optical communications, and is constituted using a package for Optical semiconductor device peculiar to the present invention and Optical semiconductor element such as a laser diode.

In the optical semiconductor device of this embodiment 1, the package for Optical semiconductor device is similar to the conventional package for Optical semiconductor device in FIG. 9 except that a mount 101 is used instead of the mount 901 in order to make high frequency characteristics good. In addition, in FIG. 1, the same elements as FIG. 9 are attached with the same code.

In the optical semiconductor device of an embodiment 1, the mount 101 of the package for Optical semiconductor devices has a mount face 101b to be mounted by a laser diode 103 and a circumference face 101a which encloses the lead terminal 112 for signal supply as shown in FIG. 1A and 1B. For example, the mount 101 is made of a metal excellent in electrical conductivity and thermal conductivity.

A sub-mount 102 is mounted on the mount face 101b and the laser diode 103 is mounted on the sub-mount 102. The mount 101 attached with the sub-mount 102 and the laser diode 103 is arranged on the upper surface of a stem-body. 113 so that the attached laser diode 103 is located in the upper part simultaneously central part of the stem-body 113 and the axis of the circumference face 101a coincide with the axis of the lead terminal 112 for signal supply. The diameter of the circumference face 101a of the mount 101 is set so as to be almost same as that of the through hole in which the lead terminal 112 for signal supply is inserted in the-package for Optical semiconductor device here. The mount 101 is made of metal such as iron, an iron alloy, copper and a copper alloy, or a metallized dielectric material and the earth conductor surrounding the lead terminal 112 for signal supply is constituted by the circumference face 101a of the mount 101 in the Optical semiconductor device of embodiment 1 .

In addition, the size of each element in the package for Optical semiconductor devices of this embodiment 1 is set within a following range.

Diameter of the stem-body 113: 2–10 mm,

Thickness of the stem-body 113: 0.5–2 mm,

Height of the lead terminal 112 for signal supply projected from the upper surface of the stem-body 113: 0.3 mm–2 mm, Height of the mount 101: 0.3 mm–2 mm, Diameter of the glass part 106 (through hole pore size): 0.3 mm–3 mm, Diameter of the lead terminal 112 for signal supply: 0.2 mm–2 mm, In the optical semiconductor device of embodiment 1 constituted as mentioned above, the signal supplied to the lead terminal 112 for signal supply is transmitted by a transmission line C and a transmission line D and is supplied to the semiconductor laser diode 103. The transmission line C is a portion constituted with an inner wall of the through hole and the glass part 106, and the lead terminal 112 for signal supply, and the transmission line D is a portion constituted with the lead terminal 112 for signal supply which were projected from the upper surface of the stem-body 113 and the circumference face 101a.

Since the transmission line D is constituted from the lead terminal 112 for signal supply projected from the upper surface of the stem-body 113 surrounded by the circumference face 101a in the package for the optical semiconductor device in this embodiment 1, the impedance of the transmission line D can be made low. Thereby, the impedance mismatching between a transmission line C and a transmission line D can be made small. With this, even if the high frequency signal of 10 Gbps or more is supplied to the semiconductor laser diode, the reflection at the boundary of the transmission line C and the transmission line D can be suppressed, so the high frequency transmission characteristic can be made good. Moreover, in this embodiment 1, when the mount 101 is made monolithically with the stem-body 113, the manufacturing will be easy.

Hereafter, the reflective characteristics between transmission lines is explained in detail contrasting with the conventional example.

Figure 10A:
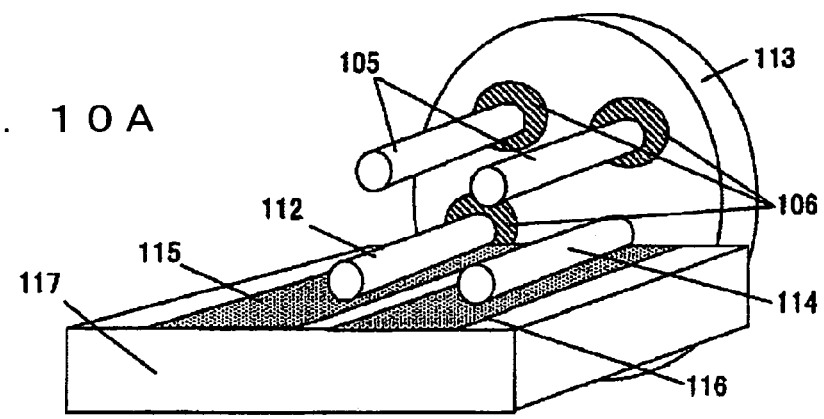
FIG. 10A is a perspective view of the rear side of the optical semiconductor device, when connected with the feeding substrate.
Figure 10B:
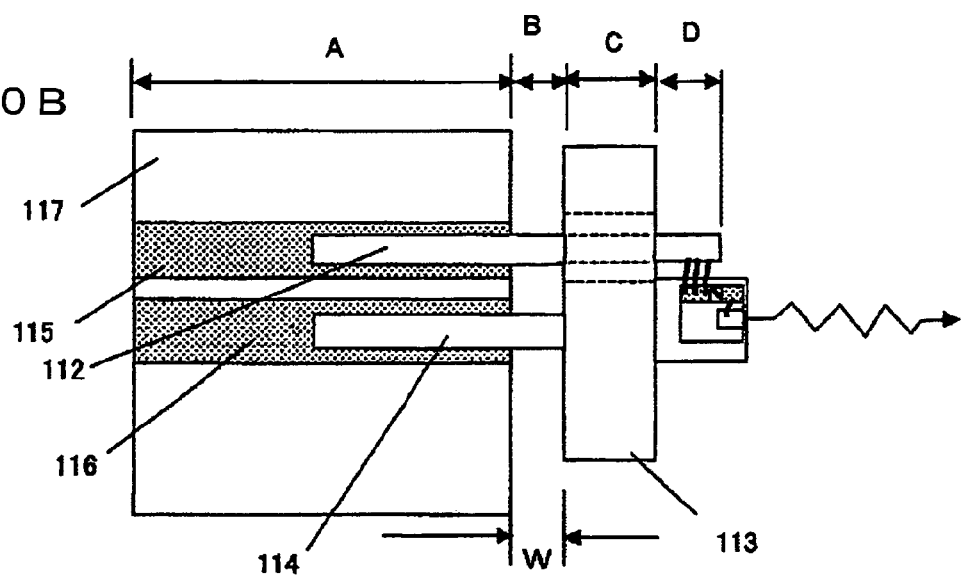
FIG. 10B is a plan view of the rear side of the optical semiconductor device, when connected with the feeding substrate.

Generally, an electric supply to an optical semiconductor device is carried out by using an electric supply substrate. For example, a high frequency signal is supplied to the optical semiconductor device, such as a laser diode, through a transmission line A, the connection portion B, a transmission line C, and a transmission line D as shown in FIG. 10. Here, the transmission line A, which is a transmission line on an electric supply substrate 117, consists of a signal line 115 and grand lines 116 formed in parallel with the signal line on the substrate 117. The signal line 115 is connected to the lead terminal 112 for signal supply and the grand lines 116 is connected to the earth lead terminal 114.

Moreover, the connection portion B, which is a connection portion between the transmission line A and the transmission line C, generates a mismatching of impedance.

Furthermore, the transmission line C is constituted by the through hole of the stem-body 113. That is to say, the transmission line C is constituted of the inner wall of the through hole, the glass part 106 and the lead terminal 112 for signal supply.

Moreover, the transmission line D is constituted with the lead terminal 112 for signal supply projected from the upper surface of the stem-body 113.

in order to supply an inputted high frequency signal to the semiconductor laser without reflecting at the connection portions of the transmission lines, it is preferable that the characteristic impedances of the transmission-lines A-D are almost same each other.

However, each impedances of the transmission-lines A–D is determined by the physical form of the element which constitutes each transmission line and it is necessary to determine the physical form of the transmission-line considering the form of the optical semiconductor-device, mechanical hardness, etc. Therefore, the physical form of the transmission-line cannot be determined freely.

When the diameter of the lead terminal 112 for signal supply is set in a range of 0.35 mm–0.45 mm, the diameter of the through hole of the stem is set in a range of 0.7–1 mm and the interval between the center of the lead terminal 112 for signal supply the center of the earth lead terminal 114 is set in a range of 1 mm–2 mm, the impedance of each transmission line is as follows That is, if the interval between the center of the lead terminal 112 for signal supply the center of the earth lead terminal 114 is set in a range of 1 mm–2 mm, the impedance Zb of a transmission line B, which is determined by the interval between the centers of the lead terminal 112 and the earth lead terminal 114, is set to about 160 ohms.

The impedance Zc of the transmission line C which is determined by the diameter (diameter of glass material) of the through hole and the diameter of the lead terminal 112 for signal supply is set to about 20 ohms.

In the structure of the conventional example of FIG. 9, the impedance Zd of the transmission line D, which is determined by the diameter of the lead terminal 112 for signal supply and the relation with other elements, is in about 70 ohms.

If the impedance Za of the signal line 115 is 25 ohms, since the impedance of the connection portion B and the impedance of the transmission line D are higher than the signal line 115, a large reflection will arise at the boundary between the transmission lines.

For example, although −10 dB or less is required for the reflection coefficient S11 at 10 GHz in order to modulate with the transmission rate of 10 Gbps, the reflection of −5 dB or more arises in the composition of the conventional FIG. 9 and good characteristics can not be obtained.

Figure 2:
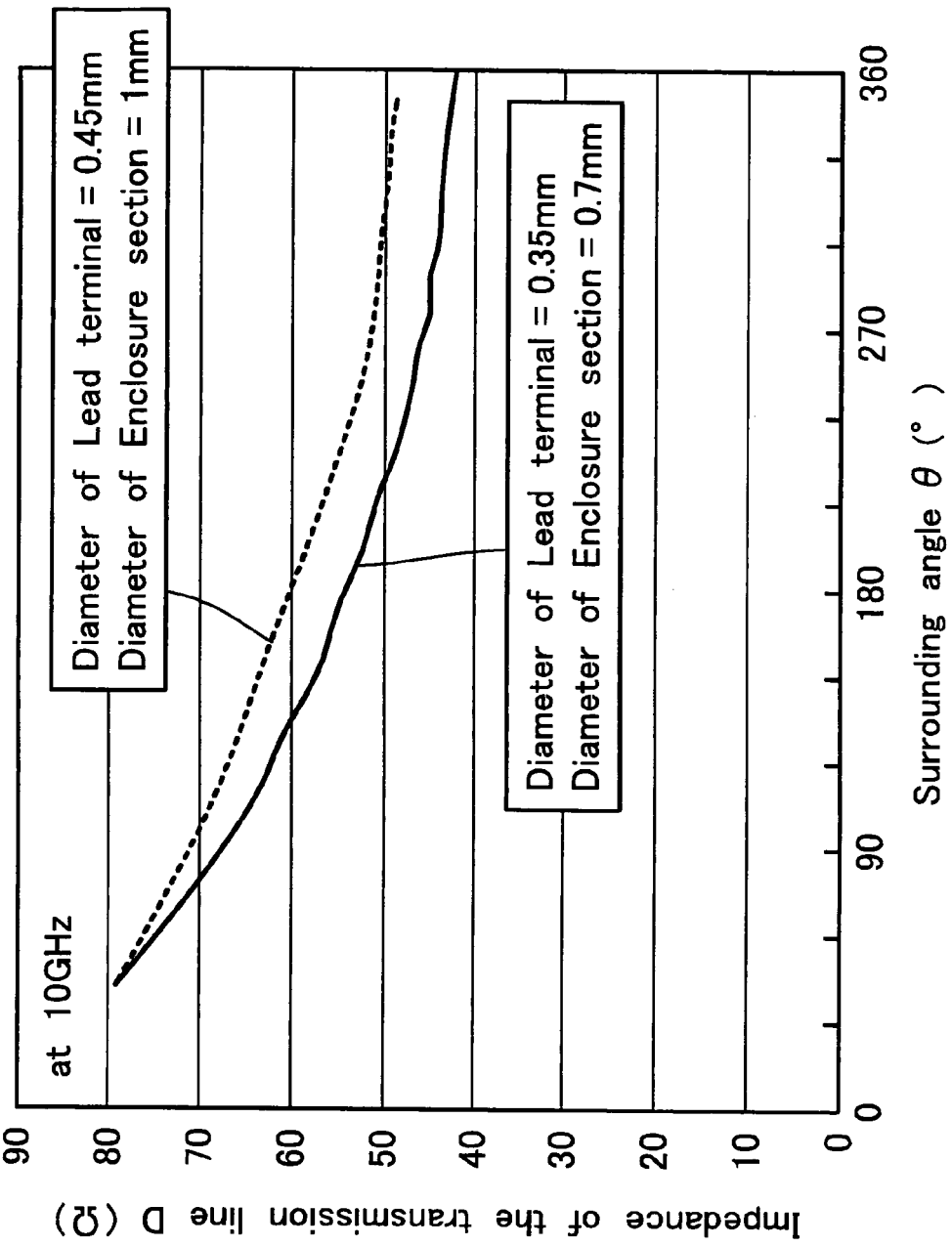
FIG. 2A is a graph showing the analyzing results of the impedance (characteristic impedance) of the transmission line D with respect to the surrounding angle θ by a three dimensional electromagnetic field simulator.
FIG. 2B is a graph showing the simulation results of the dependence of the reflection coefficient S11 (dB) on angle θ on the border between the transmission line C and the transmission line D.
Figure 2B:
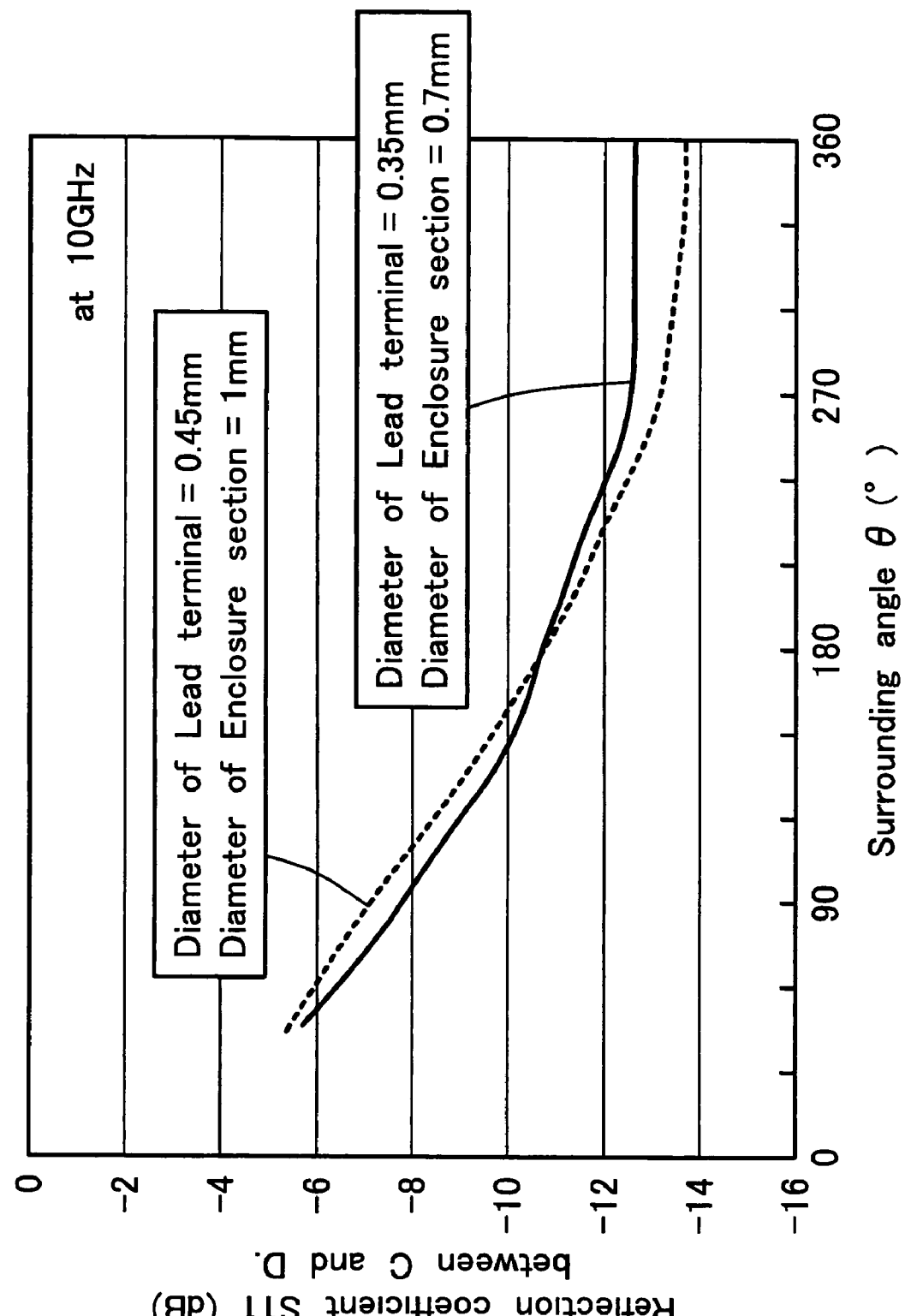

On the other hand, the reflection between the transmission line C and the transmission line D can be made small in the optical semiconductor device of this embodiment 1. The simulated impedance (characteristic impedance) of the transmission line with respect to the enclosure angle θ by the 3-dimensional electromagnetic-field simulator is shown in FIG. 2A. The simulated reflection coefficient S11(dB) at the boundary between the transmission line C and the transmission line D depending on the angle θ is shown in FIG. 2B. In FIG. 2A, 2B, the result (dashed line); which is simulated at 10 GHz on the case where the diameter of the lead terminal 112 for signal supply is set to 0.45 mm and the inside diameter of the enclosure section is set to 1 mm, the result; which is simulated at 10 GHz on the case where the diameter of the lead terminal 112 for signal supply is set to 0.35 mm and the inside diameter of the enclosure section is set to 0.7 mm, are shown. The impedances tend to lower as the enclosure angle θ becomes large, as shown in FIG. 2A. Moreover, the reflection coefficient S11 (dB) at the boundary between the transmission line C and the transmission line D is decreased as the enclosure angle θ becomes large, as shown in FIG. 2B.

In addition, it is preferable that the enclosure angle θ is 150 degrees or more so that the reflection coefficient S11 (dB) is −10 dB or less as shown in FIG. 2B. Moreover, since there is also reflection in other portions except for the boundary between the transmission line C and the transmission line D, it is preferable that the reflection coefficient S11 (dB) at the boundary between the transmission line C and the transmission line D is −12 dB or less and the enclosure angle theta for realizing the reflection of −12 dB or less is 210 degrees or more.

Thus, in a transmission line D, when the earth conductor is formed to surround at least part of the lead terminals for signal supply, that the earth conductor preferably should be formed so as to surround the lead terminal 112 for signal supply preferably in a range of 150 degrees or more centering on the axis of the lead terminal 112, more preferably in a range of 210 degree or more in order to lower the characteristic impedance of the transmission line D effectively.

Embodiment 2

The optical semiconductor device of Embodiment 2 of the present invention is composed using a package for optical semiconductor device with improved high frequency properties as will be described below. To be more specific, as shown in FIG. 3 the package for optical semiconductor device of Embodiment 2 has the same structure as the conventional package for optical semiconductor device shown in FIG. 9 except that in the conventional package the counter earth electrode part 201 made of a conductive member, a dielectric member having a metallized surface or the like is further provided adjacent to the lead terminal for signal supply 112.

In Embodiment 2, the lead terminal for signal supply 112 and the counter earth electrode part 201 compose the transmission line D, which has lower impedance than in the conventional example shown in FIG. 9.

The result is a reduction in reflection coefficient between the transmission line C and the transmission line D.

As described hereinbefore, the optical semiconductor devices of Embodiments 1 and 2 are composed using the aforementioned package for optical semiconductor device unique to the present invention, which makes them optical semiconductor devices excellent in high frequency properties.

To be more specific, the package for optical semiconductor device in the optical semiconductor devices of Embodiments 1 and 2 is provided with an earth conductor (the mount 101 in the vicinity of the circumference face 101a, the counter earth electrode part 201) adjacent to the lead terminal for signal supply projected from the upper surface of the stem body 113 so that the difference in characteristic impedance can be small between the transmission line C which is composed of a through hole perforated in the stem body 113 and the lead terminal for signal supply inserted into the through hole via glass material (in such a manner as to be insulated from the stem body) and the transmission line D which is composed of the lead terminal for signal supply 112 projected from the upper surface.

This can provide an optical semiconductor device excellent in high frequency properties.

Embodiment 3

The optical semiconductor device of Embodiment 3 of the present invention is composed using a package for optical semiconductor device with improved high frequency properties as will be described below. To be more specific, as shown in FIG. 4 the package for optical semiconductor device of Embodiment 3 has the same structure as the package for optical semiconductor device of Embodiment 2 except that in the package of Embodiment 2 a dielectric plate 301 (for example, a dielectric member having a relative permittivity of 2 to 12, more specifically made of alumina or the like) is further provided between the counter earth electrode part 201 and the lead terminal for signal supply 112.

In Embodiment 3, the lead terminal for signal supply 112, the counter earth electrode part 201, and the dielectric plate 301 compose the transmission line D. The relative permittivity of this dielectric plate which is higher than in a vacuum (in the air) enables the transmission line D to have lower impedance than in the package for optical semiconductor device of Embodiment 2 shown in FIG. 3.

The result is a reduction in the difference in characteristic impedance between the transmission line C and the transmission line D.

Although Embodiment 3 provides the dielectric plate 301 between the counter earth electrode part 201 and the lead terminal for signal supply 112 in Embodiment 2, the present invention is not restricted to this structure; in Embodiment 1, it is possible to provide a dielectric member between the circumference face 101a of the mount 101 and the lead terminal for signal supply 112, which can further reduce the difference in characteristic impedance between the transmission line C and the transmission line D in Embodiment 1.

Embodiment 4

Figure 5A:
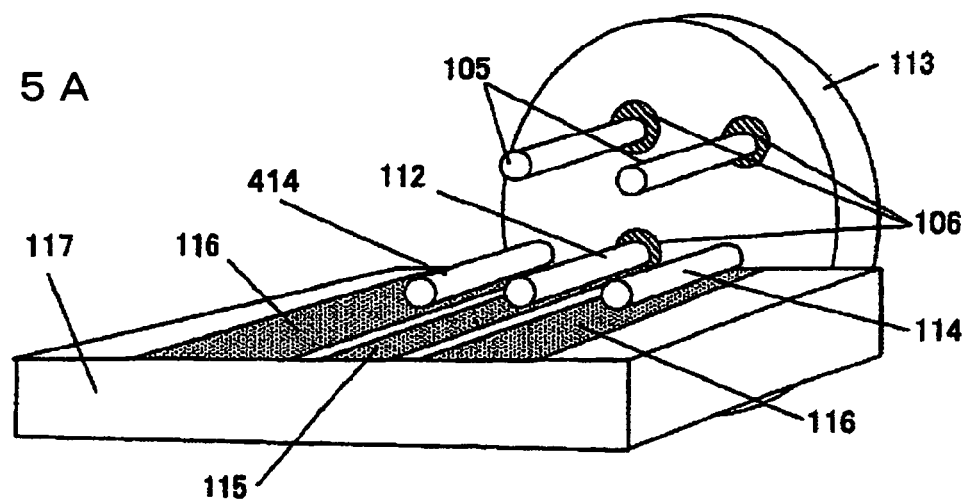
FIG. 5A is a perspective view of the rear side of the optical semiconductor device of Embodiment 4 of the present invention, when connected with the feeding substrate.
Figure 5B:
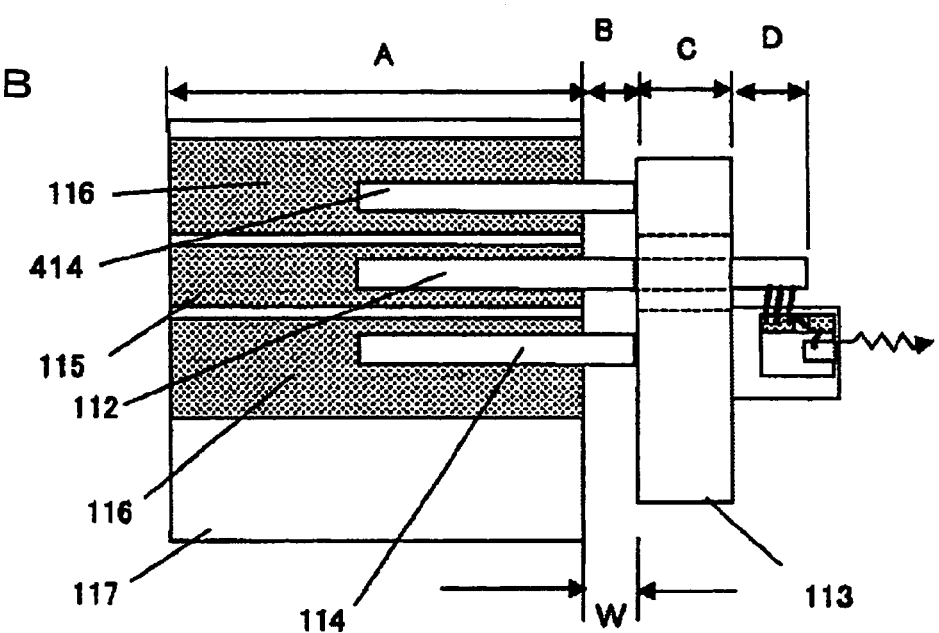
FIG. 5B is a plan view of the rear side of the optical semiconductor device of Embodiment 4 of the present invention, when connected with the feeding substrate.

The optical semiconductor device of Embodiment 4 of the present invention is composed using a package for optical semiconductor device with improved high frequency properties as will be described below. To be more specific, as shown in FIG. 5 the package for optical semiconductor device of Embodiment 4 has the same structure as the conventional package for optical semiconductor device except that in the conventional package the lead terminal for ground 414 is further provided.

In the package for optical semiconductor device of Embodiment 4, the lead terminal for ground 414 is arranged in such a manner that it sandwiches the lead terminal for signal supply 112 with the lead terminal for ground 114.

The package for optical semiconductor device of Embodiment 4 thus structured can reduce reflection in the connection part B.

Figure 6:
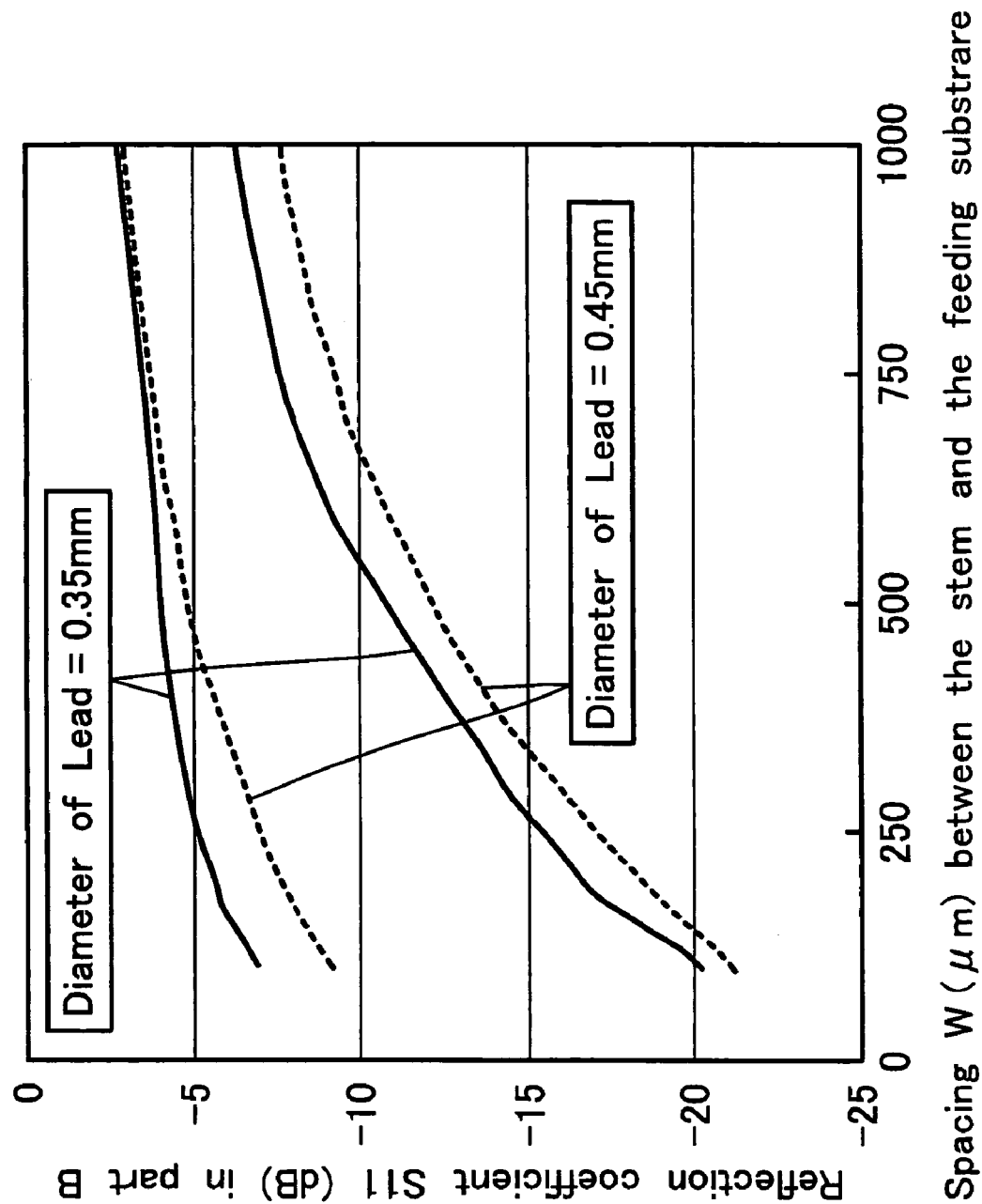
FIG. 6 is a graph showing the analyzing results of the electric reflection coefficient S11 (dB) in the connection part B by a three-dimensional electromagnetic simulator.

FIG. 6 is a graph showing the analyzing results of the electricity reflection coefficient S11 (dB) in the connection part B with respect to the spacing W (μm) between the stem body 113 and the feeding substrate 117 by a three dimensional electromagnetic field simulator. In this simulation, the spacing between the center axes of the lead terminal for ground 414 and the lead terminal for signal supply 112, and the spacing between the. center axes of the lead terminal for ground 114 and the lead terminal for signal supply 112 were set to 1 mm. The spacing between the center axes of the lead terminal for ground 114 and the lead terminal for signal supply 112 in the conventional example was also set to 1 mm.

FIG. 6 indicates that the optical semiconductor device of Embodiment 4 having the lead terminal for signal supply 112 between the lead terminal for ground 414 and the lead terminal for ground 114 can reduce the reflection coefficient S11 if the spacing W is the same. The effect of reflection coefficient reduction becomes conspicuous when the spacing between the stem body 113 and the feeding substrate is continuously reduced, compared with the conventional example.

In the optical semiconductor device of Embodiment 4 described hereinbefore, the reflection coefficient can be not more than −10 dB even when the spacing between the stem body 113 and the feeding substrate becomes 500 μm or so, which is required in the case of normal mounting method.

On the other hand, in the conventional structure of FIG. 9, the reflection coefficient becomes −5 dB when the spacing between the stem body 113 and the feeding substrate is about 500 μm.

Figure 7A:
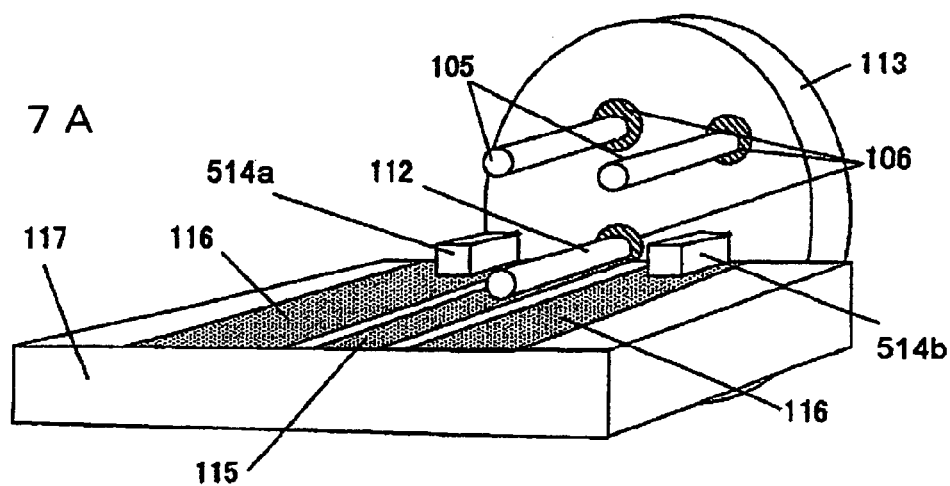
FIG. 7A is a perspective view of the rear side of the optical semiconductor device of a variation example of Embodiment 4, when connected with the feeding substrate.
Figure 7B:
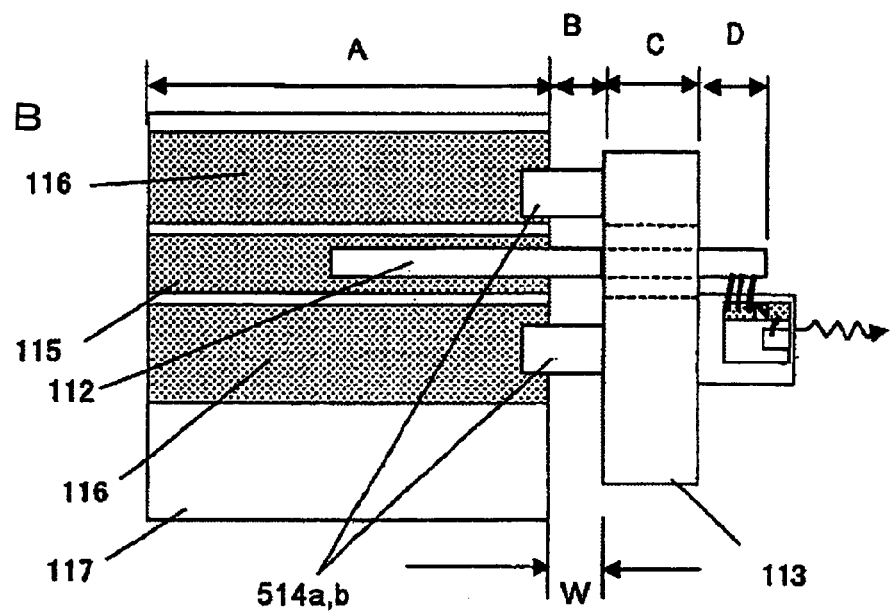
FIG. 7B is a plan view of the rear side of the optical semiconductor device of a variation example of Embodiment 4, when connected with the feeding substrate.

In the aforementioned optical semiconductor device of Embodiment 4, as shown in FIG. 7 the lead terminal for ground 414 and the lead terminal for ground 114 can be replaced by metal protrusions monolithically integrated with the stem body 113.

Embodiment 5

The optical semiconductor device of Embodiment 5 of the present invention, as shown in FIG. 8, is an optical semiconductor device of differential feeding system having two lead terminals for signal supply 112. In each of the lead terminals for signal supply 112 projected from the upper surface of the stem body 113, the same transmission line D as in Embodiment 1 is formed by being surrounded by the metallic circumference face.

The optical semiconductor device of Embodiment 5 has the same structure as that of Embodiment 4 where in the rear side of the stem body 113, each of the lead terminals for signal supply 112 is sandwiched between the lead terminals for ground 414 and the lead terminal for ground 114.

The optical semiconductor device of Embodiment 5 thus structured has both the effects of Embodiments 1 and 4, which can suppress signal reflection effectively.

As described hereinbefore, the optical semiconductor devices of Embodiments 1 to 5 of the present invention are composed using a package for optical semiconductor device which can reduce signal reflection between the transmission lines A to D, thereby providing optical semiconductor devices with excellent high frequency properties.

These embodiments describe examples having a laser device as the optical semiconductor device. However, the present invention is not restricted to this; a photoreceptor device can be used as the optical semiconductor device to obtain the same effects as those of the embodiments.

The embodiments described below show preferred embodiments when manufacturability is taken into consideration in the specific structure of the present invention.

The optical semiconductor device of Embodiment 1 shows that the characteristic impedance can be 50Ω or so by setting the surrounding angle of the lead to not less than 200 degrees.

In the stem-type package for optical semiconductor device, when it is composed of a metal conductor such as iron, the stem body 113 and the mount 101 are integrally subjected to press-processing by taking mass production properties into consideration.

However, if it is tried to form the stem-type package for optical semiconductor device of Embodiment 1 equipped with the mount 101 including the circumference face 101a shown in FIG. 1 by monolithically integrating the stem body 113 and the mount 101 by press-processing, it becomes difficult to form a mount having a sufficient surrounding angle, and it is also impossible to sufficiently lower the impedance because the edge is rounded off.

Figure 23:
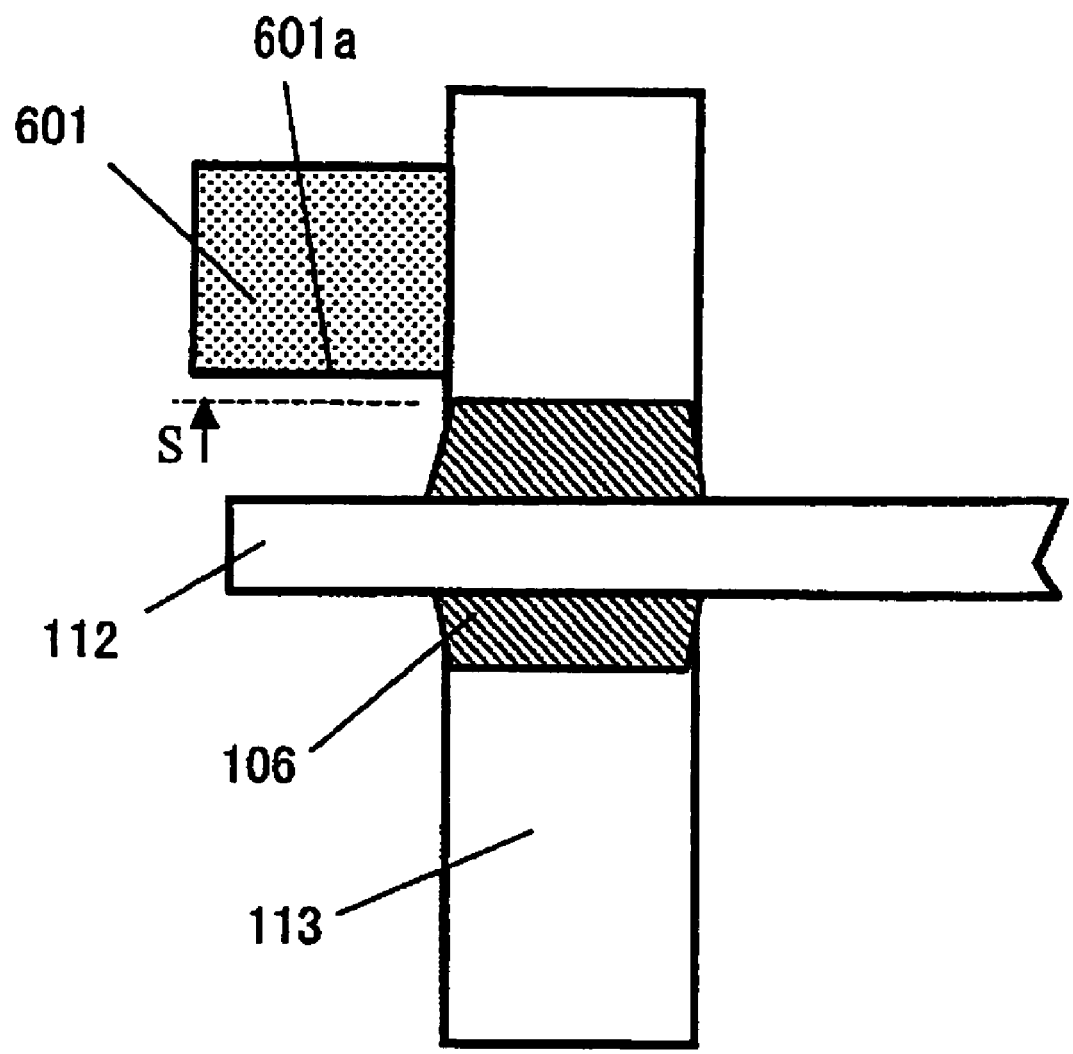
FIG. 23 is a cross sectional view taken along the line XXIII—XXIII of FIG. 22B.

To be more specific, as shown in FIGS. 22A and 22B, it is impossible to sufficiently reduce the characteristic impedance partly because the following reasons:

(1) the mount 601 to be obtained has a small surrounding angle (about 100 degrees), and a round edge (shown with the reference number 601c); and (2) if it is tried to monolithically integrate the stem body 113 and the mount 601 by press-processing, as shown in FIG. 23 the circumference face 601a of the mount 601 must be apart from the glass part 106 (the outer surface of the through hole) by a distance S (about 100 µm), making it impossible to make the circumference face 601a and the lead terminal for signal supply 112 close to each other.

If production constraints are taken into consideration, high frequency properties good enough cannot be obtained.

Therefore, Embodiments 6 to 12 provide specific embodiments of a package for optical semiconductor device capable of reducing the characteristic impedance small enough while taking the production constraints into consideration.

Embodiment 6

Figure 12:
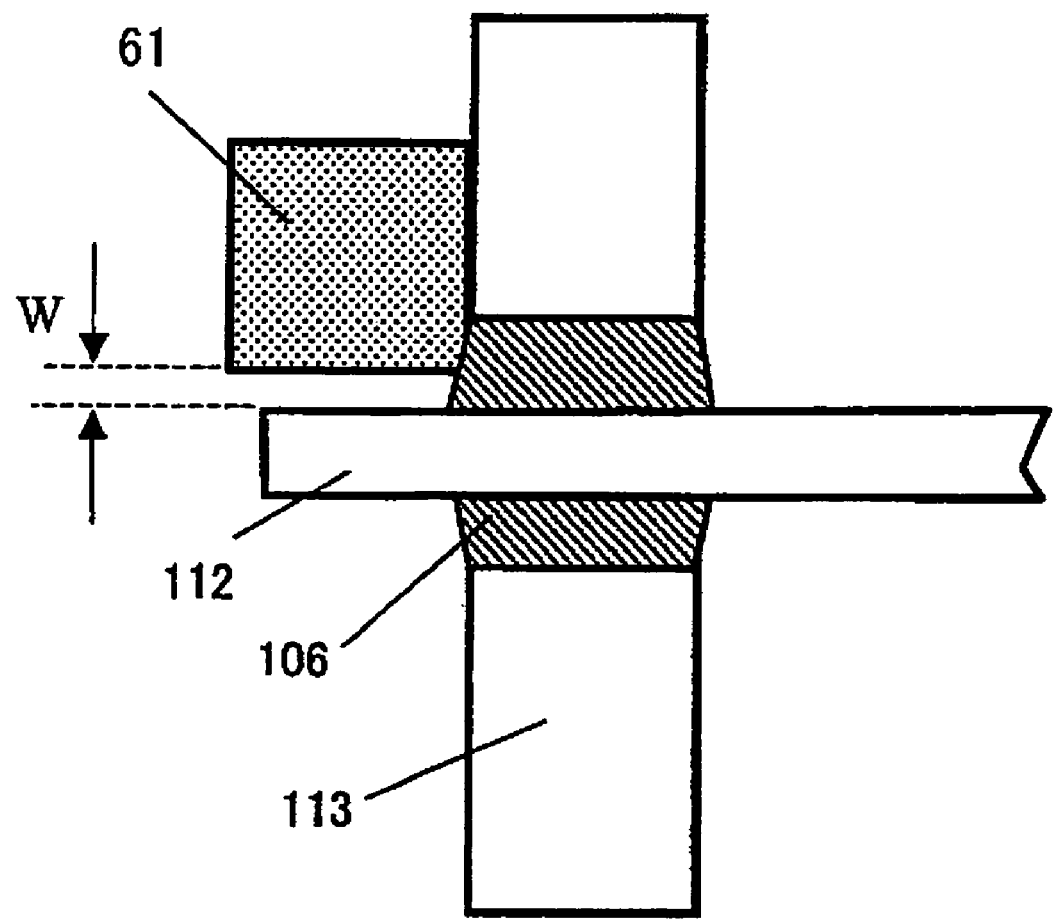
FIG. 12 is a cross sectional view taken along the line XII—XII of FIG. 11B.

FIG. 11A is a perspective view of the optical semiconductor device of Embodiment 6, and FIG. 11B is the top view thereof. FIG. 12 is a cross sectional view taken along the line XII—XII of FIG. 11B.

In the package for optical semiconductor device of Embodiment 6, a mount 61 is provided in such a manner as to cover part of the outer surface part of the glass material 106 in an attempt (1) to subject the mount 61 and the stem body 113 to press-processing separately; and (2) to reduce the distance between the circumference face 61a of the mount 61 and the lead terminal for signal supply 112.

Thus, in the package for optical semiconductor device used in the optical semiconductor device of Embodiment 6, the mount 61 having the circumference face 61a with a diameter smaller than the glass material 106 and larger than the lead terminal for signal supply 112 is first produced separately from the stem body 113 by press processing.

Then, on the stem body 113 provided with the lead terminal for signal supply 112 in the through hole via the glass material 106 is arranged the mount 61 in such a manner that the lead terminal for signal supply 112 and the circumference face 61a become coaxial.

To be more specific, in Embodiment 6, the radius Rglass of the glass material 106, the radius Rlead of the lead terminal for signal supply 112, and the radius Rcff of the circumference face 61a are set so as to satisfy the relation of Rglass>Rcff>Rlead, so that the distance W between the outer circumference of the lead terminal for signal supply 112 and the circumference face 61a can be the difference between the radius Rcff of the circumference face 61a and the radius Rlead of the lead terminal for signal supply 112 (W=Rcff−Rlead).

It goes without saying that W<Rglass−Rlead.

Figure 13:
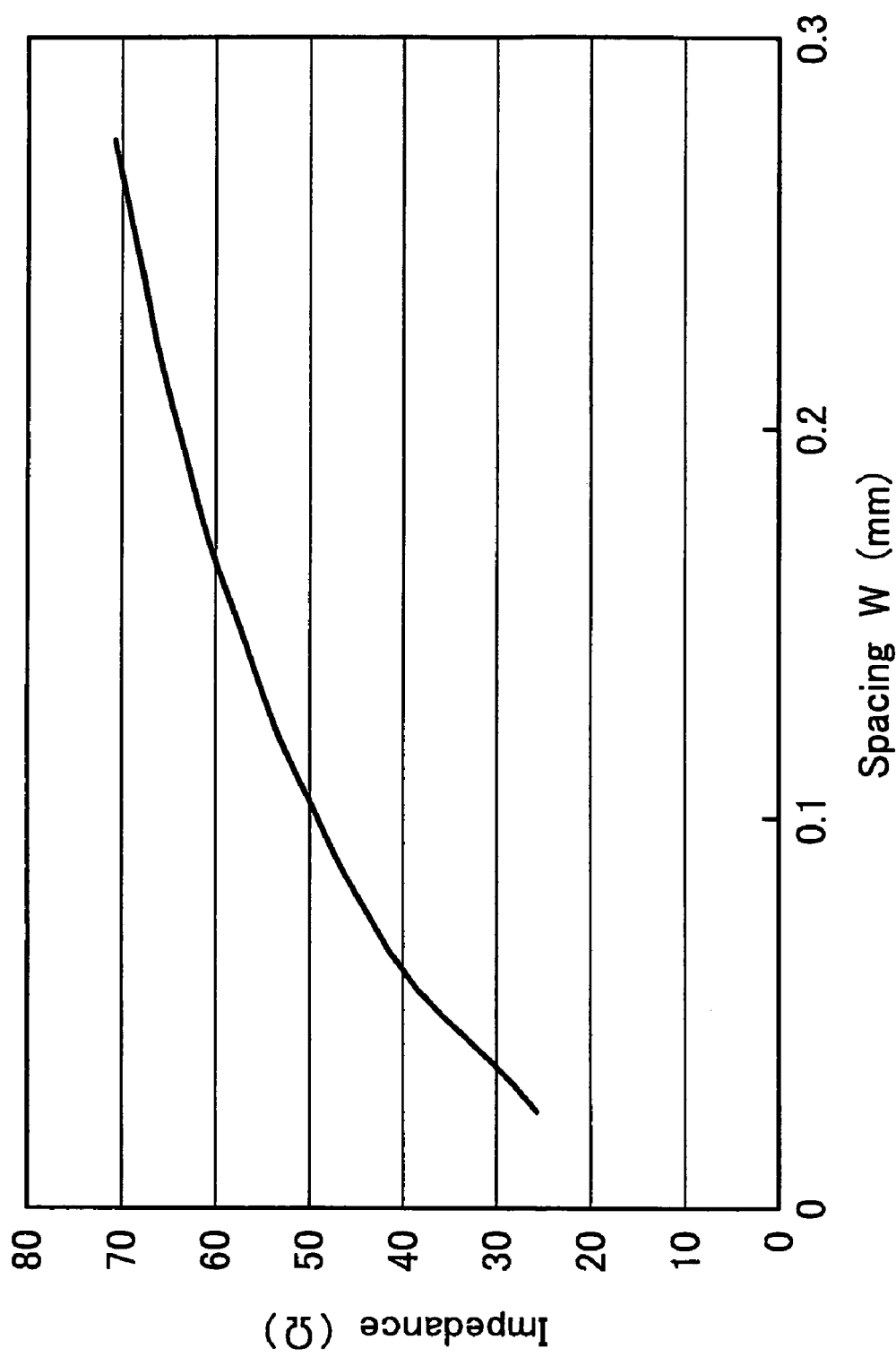
FIG. 13 is a graph showing the calculation results of the characteristic impedance when in the package for the optical semiconductor device of Embodiment 6, the spacing W between the lead terminal for signal supply 112 and a circumference face 61a is changed.

FIG. 13 shows the calculation results of the characteristic impedance when the distance W or the radius Rcff of the circumference face 61a is changed by setting the radius Rglass of the glass material 106 to 0.35 mm, the radius Rlead of the lead terminal for signal supply 112 to 0.175 mm, and the lead surrounding angle θ to 130 degrees.

In FIG. 13, in the case of W=0.175 mm (Rcff−Rlead), the outer circumference of the glass material and the circumference face 61a of the mount 61 agree with each other, and the characteristic impedance at that time is 60Ω.

In the case of W<0.175 mm, the radius Rcff of the circumference face 61a of the mount 61 becomes smaller than the radius Rglass of the outer circumference of the glass material, and the characteristic impedance becomes 60Ω or less. Assuming W=0.1 mm, the characteristic impedance can be lowered down to 50Ω.

The reason for a decrease in the characteristic impedance of the lead part with reducing the distance W is that when the distance W is decreased, the electromagnetic field at the time of transmission of the lead terminal for signal supply 112 by a high frequency signal is confined more firmly between the circumference face 61a and the lead terminal for signal supply 112.

Figure 14:
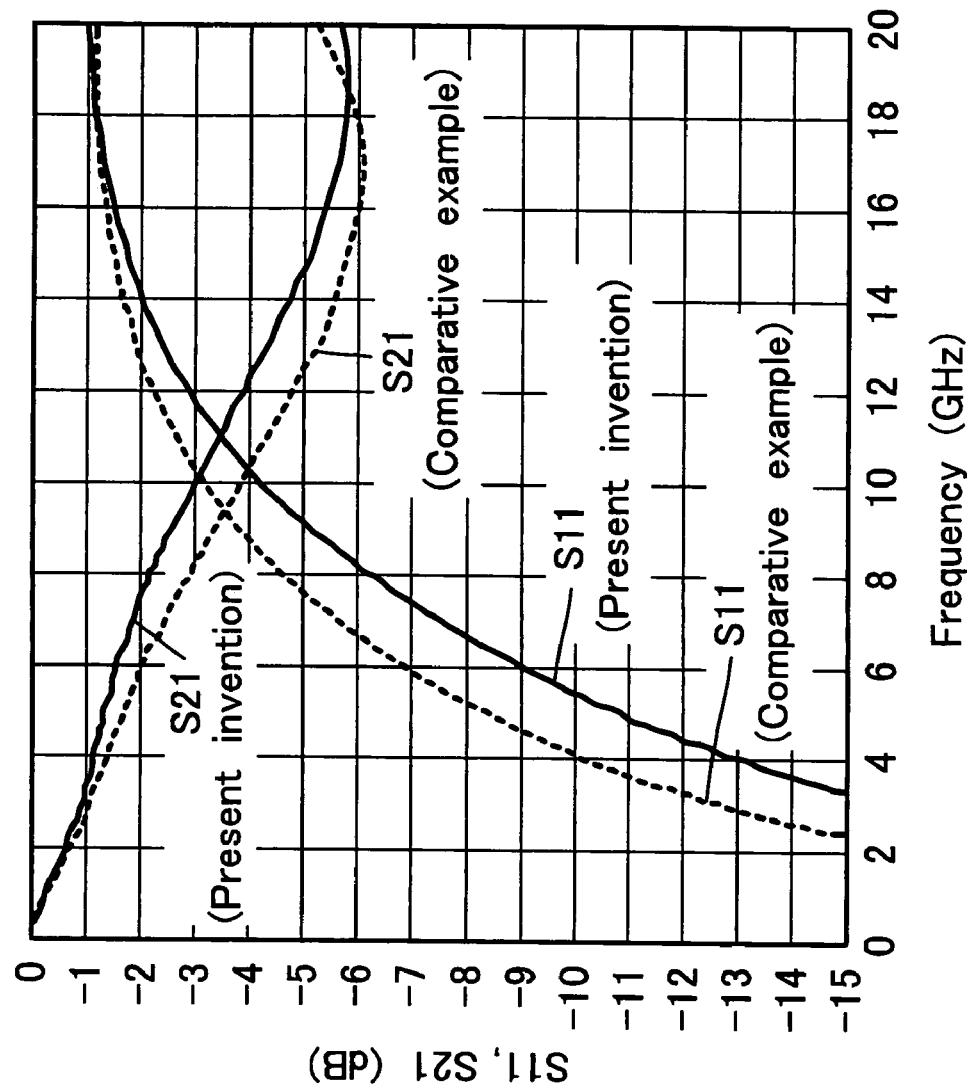
FIG. 14 is a graph showing the reflection S11 and the transmission characteristics S21 from the input terminal of the lead terminal for signal supply to the input terminal of the semiconductor laser in the optical-semiconductor device of Embodiment 6.

FIG. 14 is a graph showing the high frequency characteristics in the case of W=0.1 mm, showing the reflection S11 and the transmission characteristics S21 from the input terminal of the lead terminal for signal supply 112 to the input terminal of the semiconductor laser 103. FIG. 14 shows, in addition to the high frequency characteristics of Embodiment 6, as a comparative example, the reflection S11 and the transmission characteristics S21 from the input terminal of the lead terminal for signal supply 112 to the input terminal of the semiconductor laser 103 in the package for optical semiconductor device (surrounding angle θ=100 degrees; the distance between the lead terminal for signal supply 112 and the circumference face =0.275 mm) structured as shown in FIGS. 22A and 22B.

Thus, in the stem-type package for optical semiconductor device of Embodiment 6, as compared with the package for optical semiconductor device used for comparison, the reflection S11 in 10 GHz was reduced by about 1 dB, and the transmission characteristics S21 and the electric transmission characteristics S21 were improved by 1 dB. This is because the characteristic impedance was able to be reduced down to 50Ω.

The package for optical semiconductor device of Embodiment 6 thus structured having a comparatively small surrounding angle (130 degrees with respect to 200 degrees or larger indicated as the preferable range in Embodiment 1) can be produced by the press processing excellent in mass production properties and be excellent in high frequency characteristics because the projecting part of the lead terminal for signal supply can have low characteristic impedance by reducing the distance W.

Embodiment 7

Figure 15:
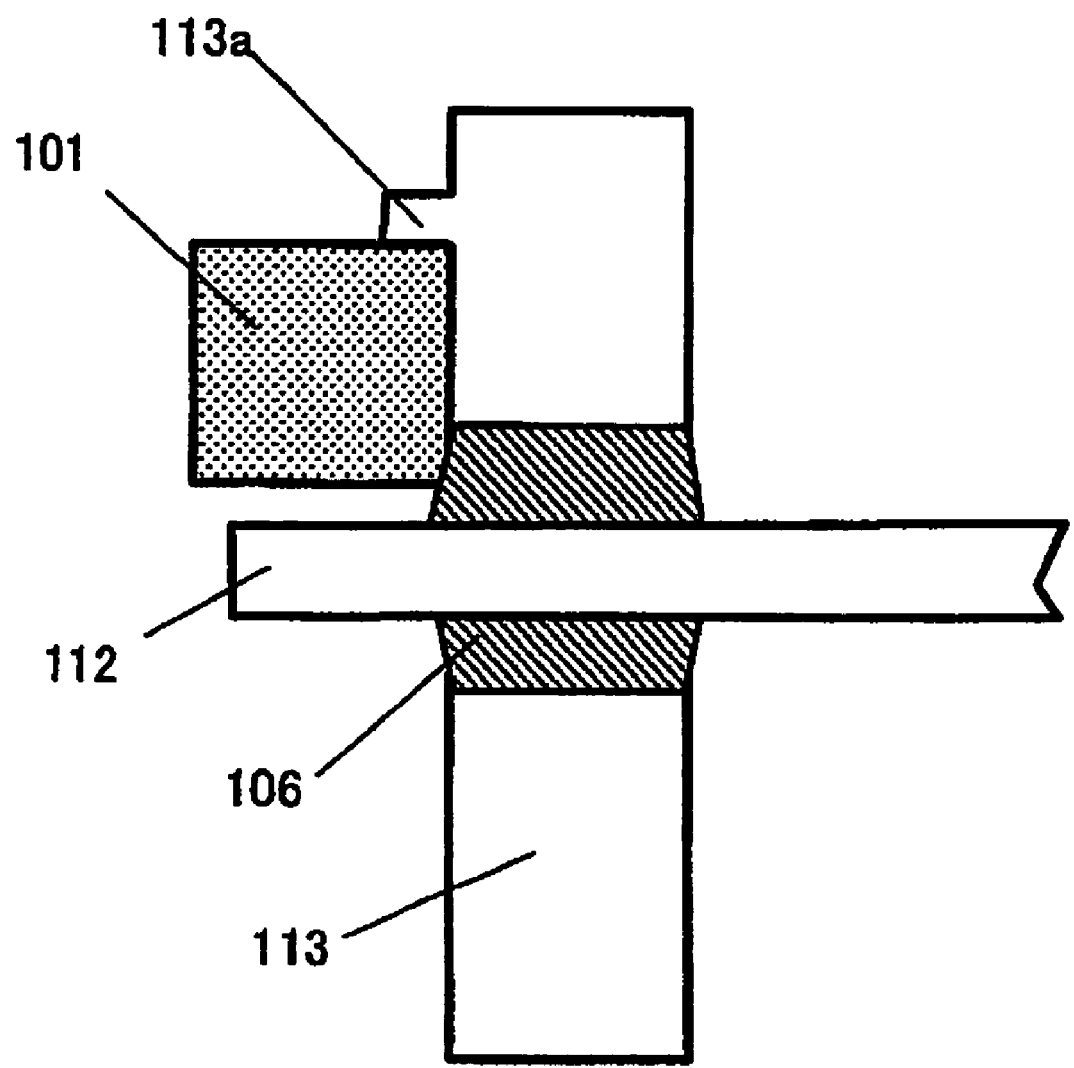
FIG. 15 is a partial cross sectional view of the lead terminal for signal supply 112 and its periphery in the optical semiconductor device of Embodiment 7.

FIG. 15 is a partial cross sectional view of the lead terminal for signal supply 112 and its periphery in the optical semiconductor device of Embodiment 7.

The optical semiconductor device of Embodiment 7 is characterized by the provision of the guide 113a for positioning the mount 101 in the stem body 113, and is designed so that the distance W between the lead terminal for signal supply 112 and the mount 101 can be set to a predetermined value in high precision (reproducibility has been improved).

Thus, in Embodiment 6, as has been explained with reference to FIG. 13, the impedance in the lead part is set depending on the value of the distance W; a change in the value of the distance W causes the value of the impedance to change (results in production variations).

In contrast, in the package for optical semiconductor device of Embodiment 7, the guide 113a can be formed in the stem body (monolithically integrated with the stem body, for example) to position the distance W between the lead terminal for signal supply 112 and the mount 61 in high precision, thereby reducing variations in the impedance of the lead part.

In the optical semiconductor device of Embodiment 7 thus structured, necessary precision in installing position can be secured when the mount 101 is installed on the stem body 113 after the stem body 113 and the mount 101 are produced separately.

Embodiment 8

Figure 16B:
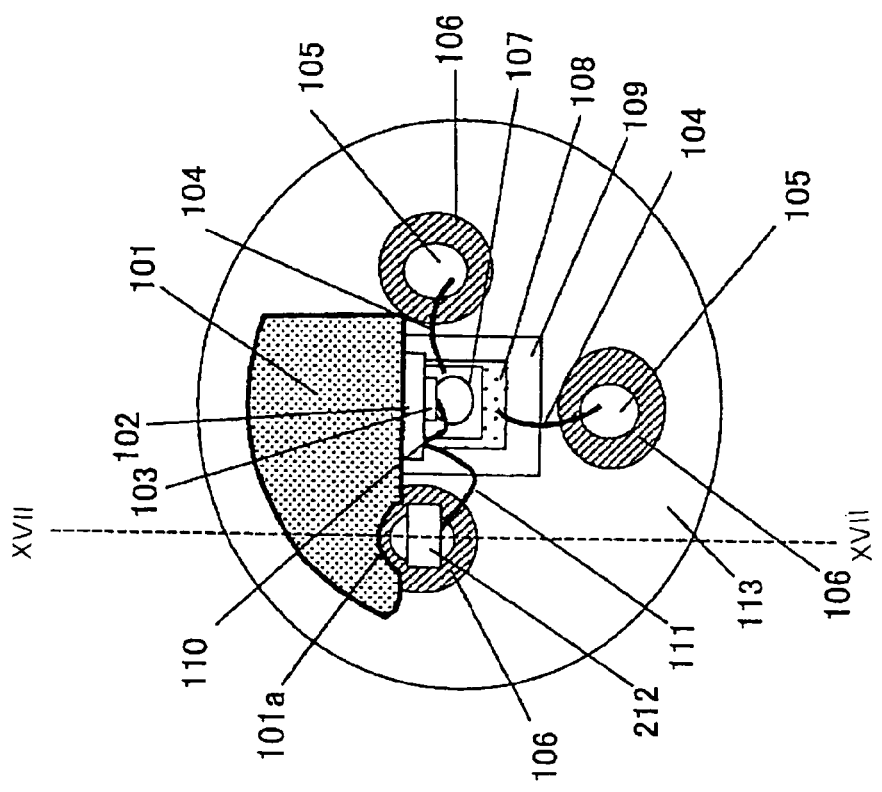
FIG. 16B is a plan view of the optical semiconductor device of Embodiment 8 of the present invention.
Figure 16A:
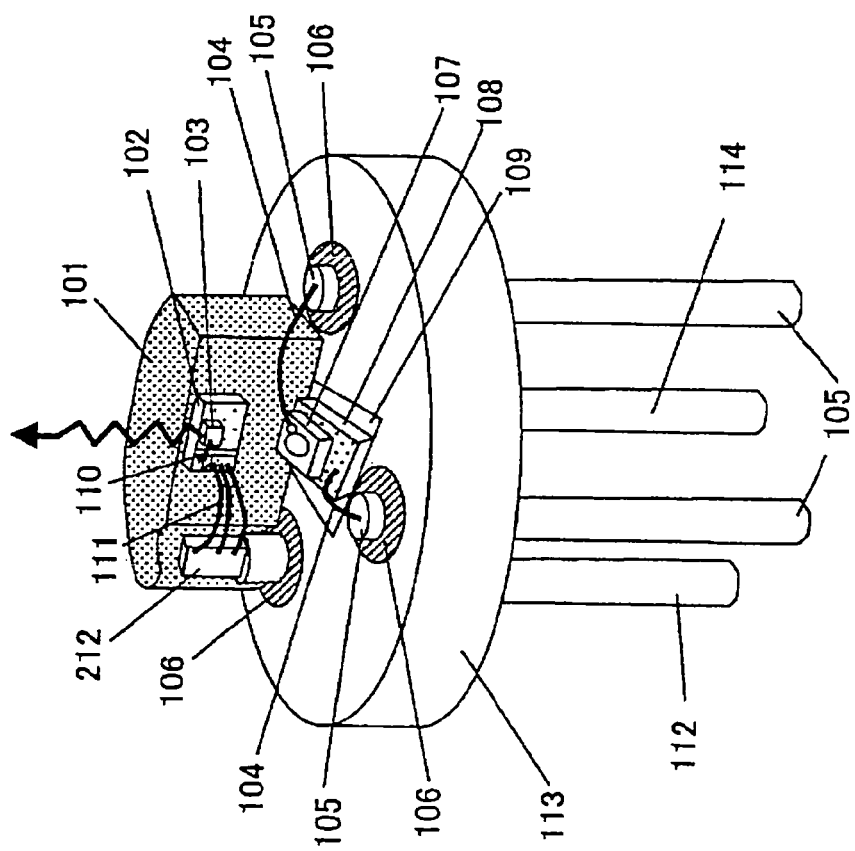
FIG. 16A is a perspective view of the optical semiconductor device of Embodiment 8 of the present invention.
Figure 17:
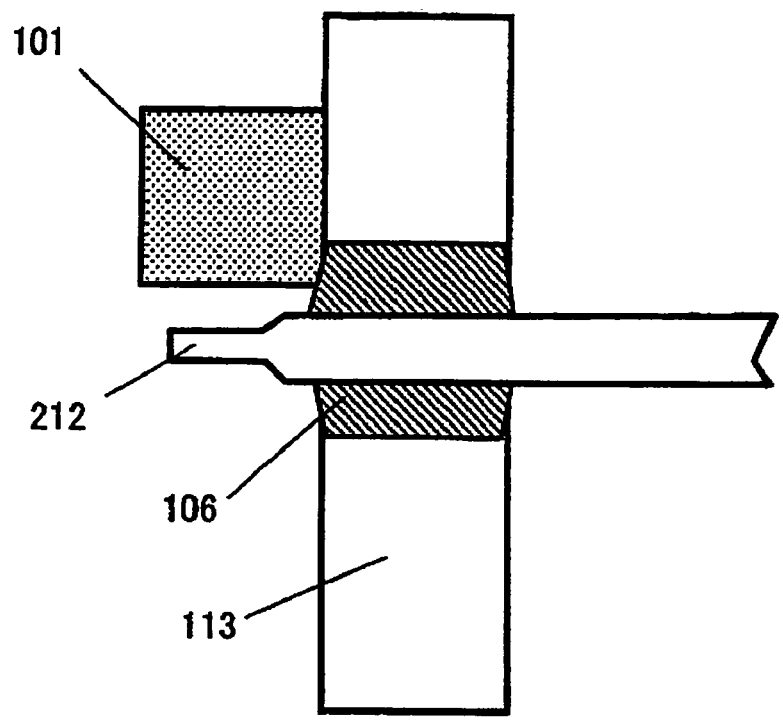
FIG. 17 is a cross sectional view taken along the line XVII—XVII of FIG. 16B.

FIG. 16A is a perspective view of the optical semiconductor device of Embodiment 8, and FIG. 1 6B is the top view thereof. FIG. 17 is a cross sectional view taken along the line XVII—XVII shown in FIG. 16B.

The optical semiconductor device of Embodiment 8 has the same structure as that of Embodiment 6 except that in the optical semiconductor device of Embodiment 6, the lead terminal for signal supply 112 is replaced by the lead terminal for signal supply 212 having a tip portion crushed flat (preferably all part projected from the stem body 113) in an attempt to increase the surface area.

In the package for optical semiconductor device of Embodiment 8, the tip portion of the lead terminal for signal supply 112 is crushed flat to increase the surface area of the portion (flat part 212), so that the surface resistance in high frequency can be reduced, lowering the characteristic impedance as the transmission line.

Also in the package for optical semiconductor device of Embodiment 8, the surface area of the flat part 212 of the tip portion is increased to enlarge the counter area against the circumference face 101a, which allows the electromagnetic field to be confined more firmly between the lead terminal for signal supply 212 and the circumference face, thereby reducing the characteristic impedance.

Embodiment 9

Figure 18:
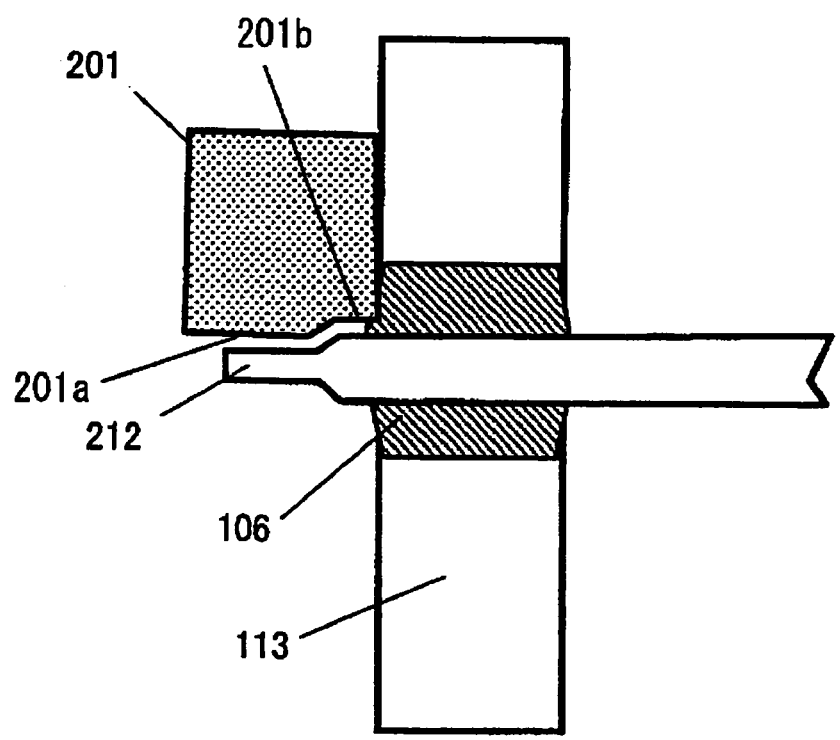
FIG. 18 is a partial cross sectional view of the lead terminal for signal supply 112 and its periphery in the optical semiconductor device of Embodiment 9.
Figure 20:
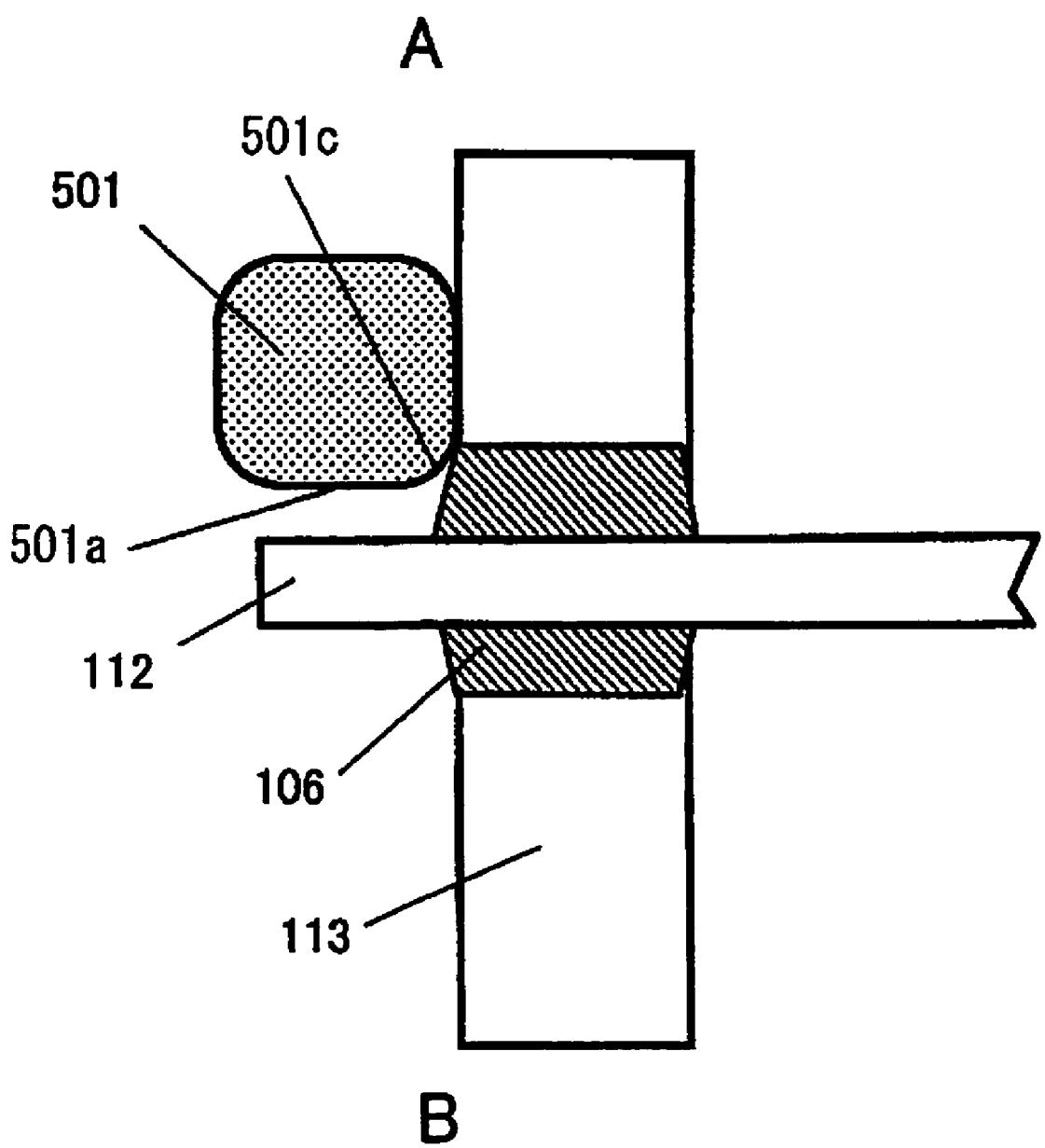
FIG. 20 is a partial cross sectional view of the lead terminal for signal supply 112 and its periphery in the optical semiconductor device of Embodiment 12.

As shown in FIG. 18 the optical semiconductor device of Embodiment 9 has the same structure as that of Embodiment 8 except that in the optical semiconductor device of Embodiment 8 the mount 101 is replaced by a mount 201m which has a counter surface crooked along with the lead terminal for signal supply 112.

When the lead terminal for signal supply 112 is cylindrical except for the flat part 212, the portion of the mount 201m that faces the lead terminal for signal supply 112 is preferably structured as follows.

Of the part of the lead terminal for signal supply 112 that is projected from the stem body 113, the surface facing the cylindrical part is made the circumference face 201b so as to closely face the outer surface (circumference face) of the lead terminal for signal supply 112 in the fixed spacing.

The surface facing the flat part 212 of the lead terminal for signal supply 112 is made the flat surface 201a so that it can closely face the flat part 212 in the fixed spacing.

In Embodiment 9, the electromagnetic field can be more firmly confined than in Embodiment 8 between the flat part 212 of the lead terminal for signal supply 112 and the flat surface 201a and also between the lead terminal for signal supply 112 and the circumference face 201b, which can further reduce the characteristic impedance of the part of the lead terminal for signal supply 112 that is projected from the stem body 113.

Embodiment 10

As shown in FIG. 19A, the optical semiconductor device of Embodiment 10 is provided with a step (concave portion) S301 in the inner edge part of the mount 301 that faces the glass material 106 so that the mount 301 can be out of contact with the glass material 106.

The optical semiconductor device of Embodiment 10 thus structured can prevent the contact between the glass material 106 and the mount 301.

To be more specific, the glass material 106 incorporated into the stem body 113 may be projected from the upper surface of the stem body as shown in FIG. 19A depending on the production method; in such a case, the contact between the glass material 106 and the mount 301 can be prevented.

Furthermore, when the stem body 113 and the mount 301 are joined to each other with solder or another material, the soldering material is prevented from adhering onto the glass material 106.

In the optical semiconductor device of Embodiment 10 thus structured, the mount 301 and the glass material 106 can be arranged apart from each other to prevent fluctuation in the characteristic impedance resulting from an unstable contact condition between the mount and the glass material 106.

Embodiment 11

As shown in FIG. 19B, the optical semi-conductor device of Embodiment 11 is provided with the plinth 113b (convex part) on which to fix the mount 101 in the stem body 113.

In Embodiment 11, the mount 101 is installed on the plinth 113b in such a manner that the circumference face 101a is projected on the lead terminal for signal supply side from the plinth 113b (convex part).

In the optical semiconductor device of Embodiment 11 thus structured, the contact between the glass material 106 and the mount 101 can be prevented in the same manner as in Embodiment 10, and even when the stem body 113 and the mount 101 are joined to each other with solder or another material, the soldering material is prevented from adhering onto the glass material 106.

Embodiment 12

As shown in FIG. 19A, in the optical semiconductor device of Embodiment 12, the inner edge part of the mount 501 that faces the glass material 106 is made the round-edged circumference face 501c.

The radius of the round-edged circumference face 501c is set so that the glass material 106 and the mount 501 can be out of contact with each other by considering the installing position of the mount 501 and the spacing between the lead terminal for signal supply 112 and the circumference face 501a facing it.

In the optical semiconductor device of Embodiment 12 thus structured, the contact between the glass material 106 and the mount 501 can be prevented, and even when the stem body 113 and the mount 501 are joined to each other with solder or another material, the soldering material is prevented from adhering onto the glass material 106.

In the aforementioned, embodiment 6 to 12, the mounts 61, 101, 201m, 301, and 501 are made of a metal such as iron, iron alloy, copper, or copper alloy or of a dielectric member having a metallized surface. The circumference faces 61a, 101a, and 201b, and the flat surface 201a compose an earth conductor surrounding (or facing) the lead terminal for signal supply 112.

VARIATION EXAMPLES

Although in Embodiments 6 to 12 there is one lead terminal for signal supply 112, the present invention is not restricted to this case. When more than one lead terminal for signal supply is used, the structure described in Embodiments 6 to 12 can be applied to each of the lead terminals for signal supply 112.

In FIGS. 21A and 21B, in the case that two lead terminals for signal supply 112a and 112b are provided to differentially operate the semiconductor laser 103, the structure described in Embodiment 6 can be applied to each of the lead terminals for signal supply 112a and 112b.

What is claimed is:

1. A package for an optical semiconductor device comprising:
    a stem having an under surface, an upper surface, a mount on the upper surface for mounting of an optical semiconductor device, and at least one through hole having a diameter and penetrating from the upper surface to the under surface,
    a lead terminal for signal supply having a central axis transverse to the upper surface, penetrating one of the through holes, and insulated by an insulator from the stem, and
    an earth conductor on the upper surface, adjacent to the lead terminal for signal supply, projecting from the upper surface, and having a circumferential face transverse to the upper surface, opposite the lead terminal for signal supply, and extending at least 150° around the central axis of the lead terminal for signal supply.

2. The package for an optical semiconductor device according to claim 1, wherein the earth conductor includes the mount monolithically.

3. The package for an optical semiconductor device according to claim 1, wherein the earth conductor overlaps with the insulator.

4. The package for an optical semiconductor device according to claim 1 including a dielectric member located between the earth conductor and the lead terminal for signal supply.

5. The package for an optical semiconductor device according to claim 1 including earth electrode terminals on opposite sides of the terminal for signal supply projecting from the under surface of the stem.

6. The package for an optical semiconductor device according to claim 1, wherein the earth electrode terminals are monolithically integrated with the stem.

7. The package for an optical semiconductor device according to claim 1 further comprising a second lead terminal for signal supply pairing with the lead terminal for signal supply.

8. The package for an optical semiconductor device according to claim 1, wherein the earth conductor includes the mount monolithically and the mount is attached to the stem so that the earth conductor overlaps the insulator.

9. The package for an optical semiconductor device according to claim 1, wherein the mount and the stem are produced by press processing, respectively.

10. The package for an optical semiconductor device according to claim 8, wherein distance between the earth conductor and the lead terminal for signal supply provides a characteristic impedance of a transmission line constituted by the lead terminal for signal supply projecting from the upper surface of the stem of no more than 60 ohms.

11. The package for an optical semiconductor device according to claim 8, wherein distance between the earth conductor and the lead terminal for signal supply is no more than 0.175 mm.

12. The package for an optical semiconductor device according to claim 8 further comprising a guide for positioning the mount on the upper surface of the stem.

13. The package for an optical semiconductor device according to claim 10, wherein a tip portion of the lead terminal for signal supply is deformed so that the characteristic impedance of said transmission line is reduced.

14. The package for an optical semiconductor device according to claim 13, wherein said lead terminal for signal supply has a cylinder shape and the tip portion is deformed by crushing the cylinder shape into a flat portion.

15. The package for an optical semiconductor device according to claim 13, wherein a face of the earth conductor surrounding the lead terminal is crooked along with the tip portion of said lead terminal for signal supply.

16. The package for an optical semiconductor device according to claim 8, wherein the mount has a step at a corner in the portion of said earth conductor overlapping the insulator so that the earth conductor does not directly contact the insulator.

17. The package for an optical semiconductor device according to claim 8, wherein the mount is located on the upper surface of the stem and including a plinth between the mount and the stem in the portion of the earth conductor overlapping the insulator so that the earth conductor does not directly contact the insulator.

18. The package for an optical semiconductor device according to claim 8, wherein the mount has a corner with a circumferential shape in the portion of the earth conductor overlapping the insulator so that the earth conductor does not directly contact the insulator.

19. The package for an optical semiconductor device according to claim 1, wherein the circumferential face lies along a circumference of a circle having, on the upper surface, a diameter not exceeding the diameter of the through hole.

20. The package for an optical semiconductor device according to claim 19, wherein the circle along which the circumferential surface lies is coaxial with the lead terminal for signal supply.

* * * * *